United States Patent
Nakajima et al.

(10) Patent No.: US 12,037,696 B2
(45) Date of Patent: *Jul. 16, 2024

(54) METHOD FOR PRODUCING SI INGOT SINGLE CRYSTAL, SI INGOT SINGLE CRYSTAL, AND APPARATUS THEREOF

(71) Applicant: GlobalWafers Co., Ltd., Hsinchu (TW)

(72) Inventors: Kazuo Nakajima, Hsinchu (TW); Masami Nakanishi, Hsinchu (TW); Yu Sheng Su, Hsinchu (TW); Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 321 days.

This patent is subject to a terminal disclaimer.

(21) Appl. No.: 17/324,108

(22) Filed: May 19, 2021

(65) Prior Publication Data
US 2021/0363656 A1 Nov. 25, 2021

Related U.S. Application Data

(60) Provisional application No. 63/093,798, filed on Oct. 20, 2020, provisional application No. 63/026,739, filed on May 19, 2020.

(51) Int. Cl.
*C30B 15/00* (2006.01)
*C30B 15/10* (2006.01)
(Continued)

(52) U.S. Cl.
CPC ............ *C30B 15/002* (2013.01); *C30B 15/10* (2013.01); *C30B 15/36* (2013.01); *C30B 29/06* (2013.01);
(Continued)

(58) Field of Classification Search
CPC ....... C30B 15/002; C30B 15/10; C30B 15/36; C30B 29/06; C30B 35/002; C30B 35/007
See application file for complete search history.

(56) References Cited

U.S. PATENT DOCUMENTS

5,462,010 A * 10/1995 Takano ................... C30B 15/02
117/214
6,514,335 B1 * 2/2003 Egashira ................. C30B 29/06
117/13
(Continued)

FOREIGN PATENT DOCUMENTS

JP 2003327493 11/2003
JP 2012224505 11/2012
(Continued)

OTHER PUBLICATIONS

Nakajima et al., "High-speed growth of Si single bulk crystals by expanding low-temperature regionin Si melt using noncontact crucible method," Journal of Crystal Growth 405 (2014) 44-51 (Year: 2014).*

(Continued)

*Primary Examiner* — Hua Qi
(74) *Attorney, Agent, or Firm* — JCIPRNET

(57) ABSTRACT

A method for producing Si ingot single crystal by NOC growth method including a Si ingot single crystal growing step and a continuous growing step is provided. The growing step includes providing a low temperature region in the Si melt where the Si ingot single crystal is grown along the surface of the Si melt or toward the inside of the Si melt, and the Si ingot single crystal has distribution of a vacancy concentration and an interstitial concentration in which respectively a vacancy concentration and an interstitial concentration vary with a distance from the growth interface; and adjusting a temperature gradient and a growth rate in the Si melt, so that along with the increasing of the distance from the growth interface, the vacancy concentration and the interstitial concentration in the Si ingot single crystal respectively decrease come near to each other.

17 Claims, 11 Drawing Sheets

(51) Int. Cl.
 *C30B 15/36* (2006.01)
 *C30B 29/06* (2006.01)
 *C30B 35/00* (2006.01)

(52) U.S. Cl.
 CPC .......... *C30B 35/002* (2013.01); *C30B 35/007* (2013.01); *Y10T 117/1008* (2015.01)

(56) References Cited

U.S. PATENT DOCUMENTS

| | | | | |
|---|---|---|---|---|
| 7,060,133 | B2* | 6/2006 | Nawata | C30B 29/12 117/214 |
| 2005/0120944 | A1* | 6/2005 | Hong | C30B 15/20 117/13 |
| 2006/0144321 | A1* | 7/2006 | Lu | C30B 15/22 117/30 |
| 2007/0000429 | A1* | 1/2007 | Lida | C30B 15/203 117/13 |
| 2007/0227189 | A1* | 10/2007 | Sakai | C30B 29/06 65/83 |
| 2009/0188426 | A1* | 7/2009 | Lew | C30B 29/06 117/206 |

FOREIGN PATENT DOCUMENTS

| | | |
|---|---|---|
| JP | 5398775 | 1/2014 |
| JP | 2019218245 | 12/2019 |
| TW | 202001016 | 1/2020 |

OTHER PUBLICATIONS

"Office Action of Japan Counterpart Application", issued on May 10, 2022, p. 1-p. 3.
Office Action of Taiwan Counterpart Application, issued on Oct. 28, 2021, pp. 1-3.
Kazuo Nakajima et al., "Applications of novel effects derived from Si ingot growth inside Si melt without contact with crucible wall using noncontact crucible method to highefficiency solar cells", Journal of Crystal Growth, vol. 486, Jun. 2017, pp. 705-709.
Maulid Kivambe et al., "Emerging Technologies in Crystal Growth of Photovoltaic Silicon: Progress and Challenges", SNEC 11th International Photovoltaic Power Generation Conference & Exhibition, SNEC 2017 Scientific Conference, Apr. 17-20, 2017, pp. 7-13.
Kazuo Nakajima et al., "Theoretical distributions of point-defect concentration in a Si ingot grown inside a melt using the noncontact crucible method considering the accumulation effect of diffusion flux", Journal of Crystal Growth, vol. 547 (2020) 125810, Jul. 2020, pp. 1-9.

* cited by examiner

METHOD FOR PRODUCING SI INGOT SINGLE CRYSTAL, SI INGOT SINGLE CRYSTAL, AND APPARATUS THEREOF

CROSS-REFERENCE TO RELATED APPLICATION

This application claims the priority benefit of U.S. provisional application Ser. No. 63/026,739, filed on May 19, 2020 and U.S. provisional application Ser. No. 63/093,798, filed on Oct. 20, 2020. The entirety of each of the above-mentioned patent applications is hereby incorporated by reference herein and made a part of this specification.

BACKGROUND

Technology Field

The disclosure relates to semiconductor manufacturing technology, and in particular, to a method for producing a Si ingot single crystal grown with ultra-low defects, a Si ingot single crystal, and an apparatus thereof.

Description of Related Art

With the development of high-tech technologies such as communications, display, solar cells, and artificial intelligence (AI), the information society will develop more vigorously in the future. As the dominant material of semiconductor components supporting the development of the foregoing technologies, the quality of Si ingot single crystals is highly required. Therefore, the demand for high-quality Si ingot single crystals for the high-tech technologies is also increasing.

Currently, such ultra-high-quality Si ingot single crystals are mainly produced by the Czochralski growth method (hereinafter referred to as the "CZ growth method"). FIG. 1 is a schematic view of a conventional apparatus for growing a Si ingot single crystal by the CZ growth method. Referring to FIG. 1, an apparatus 10 for growing a Si ingot single crystal by the CZ growth method includes a crucible 12, a Si melt 13 disposed in the crucible 12, and a pulling mechanism 15 for pulling up a Si ingot 14 to be grown. As shown in FIG. 1, when a crystal is grown by the CZ growth method, a growth interface GI is formed above the surface of the Si melt. The Si melt formed with the growth interface includes mainly a thin and small-volume melt that bulges from the surface due to surface tension shown as the convex growth interface GI in FIG. 1. Therefore, when a crystal is grown by the CZ growth method, the difficulty in controlling the temperature distribution in such thin and small-volume melt forming the growth interface has become a technical problem to be solved. More specifically, the following method is used to reduce the concentration of point defects in producing defect-free Si ingot single crystals by the CZ growth method: making the temperature gradient near the growth interface abrupt to increase the diffusion flux of interstitial Si atoms, and thereby annihilating vacancies through a pair-annihilation. That is, the concentration of each point defect is reduced as much as possible by reducing both the vacancy concentration and the interstitial concentration.

However, in the related art using the CZ growth method, there is a relative narrow range of Si ingot single crystal crystals near the growth interface that can be used to control point defects. In such a control, the growth rate $\upsilon$ needs to control the growth conditions of the Si ingot single crystals in a very precise and complex manner. Specifically, these control variables include at least the uniform temperature distribution along the growth interface, the control of the temperature gradient, and the pulling rate. Not a complete theoretical solution to the complex control has been developed in the related art, and a try and error method is adopted in most related art, so the defect-free technology by using the CZ growth method in the related art lacks universality and reproductivity.

In recent years, to solve the problem of the CZ growth method, Patent Document 1 proposes another method for growing a Si ingot single crystal, the noncontact crucible (NOC) growing method, by which a Si ingot single crystal can be grown within a Si melt without contacting the crucible wall. As shown in FIG. 2, with the NOC growth method, a large low temperature region disposed in the Si melt is adopted, and a Si ingot single crystal is grown within the Si melt.

However, how to effectively grow defect-free and ultra-high-quality Si ingot single crystals by the NOC growth method remains unsolved, and a complete theoretical solution is required in the related art.

Moreover, the world feels an urgent need to develop high-quality Si ingot single crystals that can be produced universally and reproducibly. To tackle the technical issue, it is necessary to control the growth environment of Si ingot single crystals and precisely control the grown Si ingot single crystals, and the development is indispensable so that it can be correspondingly applied to the producing of a large number of ultra-precision semiconductor components that will support AI in the future.

Therefore, the inventors feel that the technical issue can be tackled. With the dedication to research on the issue and with the application of scientific principles, the disclosure with reasonable design and effective improvement of the technical issue is proposed.

Patent Document 1: JP Patent No. 5398775

SUMMARY

The disclosure provides a Si ingot single crystal, a method and an apparatus for producing the Si ingot single crystal, which are capable of completely establishing the simulation relationship between lattice vacancy and inter-lattice flux in the NOC growth method, and accordingly the process parameters affecting defects of the Si ingot single crystal in the NOC growth method may be completely acquired, so as to obtain ultra-low defect (or defect-free) Si ingot single crystals. The method and the apparatus for producing the Si ingot single crystal of the disclosure are capable of realizing an effectively grown, defect-free, and ultra-high-quality Si ingot single crystal through a complete developed theory.

The quality required for highly integrated Si ingot single crystals currently used in semiconductors is ultra-high-quality silicon single crystals with vacancy concentration and interstitial concentration less than or equal to $1 \times 10^{14}/cm^3$. Meanwhile, the COP concentration of a fine defect with a size of 0.1 μm that gathers vacancies in the Si ingot single crystal is on the order of $10^7/cm^3$, so it can be regarded that the Si ingot single crystal formed under the concentration almost has no defects. Meanwhile, with the vacancy concentration, an oxidation induced stacking fault (OSF) ring or a cyclic oxidation induced stacking fault almost disappears.

The disclosure provides a method for producing a Si ingot single crystal. The Si ingot single crystal is produced by a noncontact crucible (NOC) method. The method for producing the Si ingot single crystal includes a Si ingot single crystal growing step as follows. The Si ingot single crystal is grown within a Si melt disposed in a crucible, and the Si ingot single crystal growing step includes the following steps. A low temperature region is disposed in the Si melt. A Si seed crystal is disposed to contact a surface of the Si melt to start crystal growth, the Si ingot single crystal is grown along the surface of the Si melt or toward the inside of the Si melt, and the Si ingot single crystal has a vacancy concentration distribution and an interstitial concentration distribution in which a vacancy concentration and an interstitial concentration respectively vary with a distance from the growth interface. A temperature gradient in the Si ingot single crystal and a growth rate of the Si ingot single crystal in the Si melt are adjusted so that in the vacancy concentration distribution and the interstitial concentration distribution, along with the increase of the distance from the growth interface, the vacancy concentration and the interstitial concentration in the Si ingot single crystal respectively decrease and come near to each other.

In an embodiment of the disclosure, the temperature gradient in the Si ingot single crystal growing step ranges from of 2 K/cm to 220 K/cm.

In an embodiment of the disclosure, the growth rate in the Si ingot single crystal growing step ranges from of 0.0002 cm/s to 0.002 cm/s.

In an embodiment of the disclosure, the Si ingot single crystal is grown until a point defect of the Si ingot single crystal is $1\times10^{14}/cm^3$ or less, or the COP concentration of the Si ingot single crystal is $1\times10^7/cm^3$ or less.

In an embodiment of the disclosure, the Si ingot single crystal growing step includes a critical distance Zc where the vacancy concentration in the Si ingot single crystal and the interstitial concentration are equal in the pulling axis direction. In the embodiment, the critical distance Zc in the Si ingot single crystal decreases as the temperature gradient increases.

In an embodiment of the disclosure, in the Si ingot single crystal growing step, different kinds of temperature gradients are used as different growth stages during growth of the Si ingot single crystal. In the embodiment, the different growth stages with different temperature gradients includes a first growth stage of a first temperature gradient closer to the growing interface and a second growth stage of a second temperature gradient far away the growing interface, and the first temperature gradient is less than the second temperature gradient. In the embodiment, the vacancy concentration distribution and the interstitial concentration distribution between two different temperature gradients respectively have a changing point, and both the vacancy concentration and the interstitial concentration rapidly decreases after the changing point. In the embodiment, the first temperature gradient is 10 K/cm, and the second temperature gradient is 20 K/cm.

In another embodiment of the disclosure, the different growth stages with different temperature gradient includes a first growth stage of a first temperature gradient closer to the growing interface, a second growth stage of a second temperature gradient, and a third growth stage of a third temperature gradient far away the growing interface. The first temperature gradient is less than the second temperature gradient, and the second temperature gradient is less than the third temperature gradient. In the embodiment, the Si ingot single crystal growing step includes a critical distance Zc where the vacancy concentration in the Si ingot single crystal and the interstitial concentration are equal, and the critical distance Zc is in the second growth stage of the second temperature gradient.

In an embodiment of the disclosure, the method for producing the Si ingot single crystal further includes the following steps. A bottom heater is disposed under the bottom of the crucible and a thermal insulator is disposed between the bottom heater and the crucible, so as to form the lower temperature region, where a diameter of the thermal insulator is less than a diameter of the crucible. In the embodiment, the plate below the crucible bottom contains both the thermal insulator in its central portion and the graphite plate in its periphery portion. The thermal insulator forms the central portion with poor thermal conductivity and a graphite plate forms the periphery portion with good thermal conductivity disposed around the central portion. Moreover, in an embodiment, a thermal conductivity of the central portion substantially at the Si melting temperature ranges from 0.15 W/mk to 0.55 W/mk, for example; and a thermal conductivity of the periphery portion at the Si melting temperature ranges from 20 W/mk to 60 W/mk, for example.

In an embodiment of the disclosure, the obtained Si ingot single crystal includes an upper Si ingot single crystal part disposed above the Si melt surface and a lower Si ingot single crystal part disposed within the Si melt, which is called as the remaining Si ingot single crystal part. The upper Si ingot single crystal part continuously increases by the pulling step. The remaining part continuously changes by the pulling step to add in the upper Si ingot single crystal part disposed above the Si melt surface. Thus, the remaining Si ingot single crystal part is grown within the Si melt and simultaneously pulled up through performing the continuous growing step by the NOC growth method, and the method for producing the Si ingot single crystal further includes a pulling step and while performing the continuous growing step of the remaining Si ingot single crystal part, the pulling step of pulling the upper Si ingot single crystal part together with pulling the remaining Si ingot single crystal part is repeated. In the pulling step, the upper Si ingot single crystal part is pulled up together with the remaining Si ingot single crystal part along a pulling axis direction and the lower part of remaining Si ingot single crystal part is still remained within the Si melt while performing the continuous growing step of the remaining Si ingot single crystal part.

In an embodiment of the disclosure, the method for producing the Si ingot single crystal further includes the steps of supplying a Si raw material in a form of chips or melt into the Si melt. A supply weight of the Si raw material is controlled to be substantially equal to a weight of the upper Si ingot single crystal part pulled in the pulling step, and a position of the growth interface is substantially fixed.

The disclosure provides a Si ingot single crystal, which is grown by the NOC growth method. A point defect of the Si ingot single crystal is $1\times10^{14}/cm^3$ or less.

In an embodiment of the disclosure, the COP concentration of the Si ingot single crystal is $1\times10^7/cm^3$ or less.

The disclosure provides an apparatus for producing a Si ingot single crystal by the NOC growth method; and the apparatus includes a crucible, a Si melt, a Si ingot single crystal, a temperature gradient controller, a melt level controller, a pulling mechanism, and a Si raw material supplier. The Si melt is disposed in the crucible, and the Si melt has a lower temperature region. The Si ingot single crystal is grown in the low temperature region and has a growth rate. The Si ingot single crystal has a growth interface between the Si ingot single crystal and the Si melt. The Si ingot single crystal has a vacancy concentration distribution and an interstitial concentration distribution in which a vacancy concentration and an interstitial concentration respectively vary with a distance from the growth interface. The temperature gradient controller provides a temperature gradient in the Si ingot single crystal while the Si ingot single crystal is growing, so that in the vacancy concentration distribution and the interstitial concentration distribution, along with the increase of the distance from the growth interface, the vacancy concentration and the interstitial concentration in the Si ingot single crystal respectively decrease and come near to each other. The melt level controller is disposed to control a melt level of the Si melt, and the grown Si ingot single crystal includes an upper Si ingot single crystal part disposed above the melt surface and a remaining Si ingot single crystal part disposed within the Si melt. Here, the obtained Si ingot single crystal includes an upper Si ingot single crystal part disposed above the Si melt surface and a lower Si ingot single crystal part disposed within the Si melt, which is called as the remaining Si ingot single crystal part. The upper Si ingot single crystal part is pulled up together with pulling the remaining Si ingot single crystal part by the pulling mechanism along a pulling axis direction, and a part of the remaining Si ingot single crystal part is still remained within the Si melt while simultaneously performing the continuous growing step of its remaining Si ingot single crystal part.

In the Si raw material supplier, the Si raw material is supplied in a form of chips or melt into the Si melt, and a supply weight of the Si raw material supplier is controlled to be substantially equal to a weight of the upper Si ingot single crystal part pulled by the pulling mechanism.

In an embodiment of the disclosure, the apparatus for producing the Si ingot single crystal further includes a dopant supplier, and a dopant is supplied into the Si melt.

Based on the above, according to the disclosure, the control factors for producing ultra-high-quality Si ingot single crystals are mainly achieved by controlling the temperature gradient, and the growth rate of the Si ingot single crystal correlates with the temperature gradient. Moreover, based on the growth rate of the remaining Si ingot single crystal in the Si melt, the upper Si ingot single crystal part on the surface of the Si melt is passively pulled up, thereby controlling the crystal growth length of the Si ingot single crystal. Therefore, with the Si ingot single crystal, the method and the apparatus for producing the Si ingot single crystal of the disclosure, basically there is no need to control the temperature distribution, the temperature gradient, and the pulling rate near the growth interface in an extremely precise and complex manner. Accordingly, with universality and good controllability, the Si ingot single crystal, the method, and the apparatus thereof in the disclosure can be used for producing Si ingot single crystals with excellent quality.

DESCRIPTION OF THE EMBODIMENTS

Regarding the technical problem, the inventors have devoted to research on the noncontact crucible (NOC) growth method and the details of the research is as follows.

A Si ingot single crystal is grown within a Si melt in the NOC growth method, while a Si ingot single crystal is grown above the surface of the Si melt in the Czochralski growth method (hereinafter refers to CZ growth method), so the temperature distribution of the Si ingot single crystal grown in the NOC growth method is completely different from the temperature distribution of the Si ingot single crystal grown in the CZ growth method. However, the knowledge of the distribution of point defects (e.g., vacancies and interstitial Si atoms) of the Si ingot single crystals grown in the NOC growth method remains limited. To clarify the distribution of the point defects, the inventors proposed a simulation model to calculate the distribution of the point defects of the Si ingot single crystals grown in the NOC growth method. From the theoretical basis developed by the disclosure, the accumulation of diffusion fluxes of vacancies and interstitial Si atoms has an influence on the vacancy concentration and interstitial concentration, which are considered important factors for the NOC growth method; and because of the relatively mild temperature gradient inside the Si melt, the diffusion fluxes may continuously affect the concentration of the Si ingot single crystal being grown at the moving interface, which is one of major advantages of the NOC growth method. Moreover, the inventors also calculated the vacancy concentration and interstitial concentration among the diffused point defects during the growth process after a dynamically balanced pair-annihilation, and developed that the distribution of the vacancy concentration and the interstitial concentration respectively vary along with the distance from the growth interface. More specifically, the distance can be calculated by a function of the distance from the growth interface. By selecting appropriate growth conditions, it is found that each vacancy concentration and interstitial concentration on the entire Si ingot single crystal are very close to one another, especially near the critical point. The inventors found that the cross point of the vacancy concentration and the interstitial concentration mainly depends on the temperature gradient.

Comparison Between the CZ Growth Method and the NOC Growth Method

Figure 1:
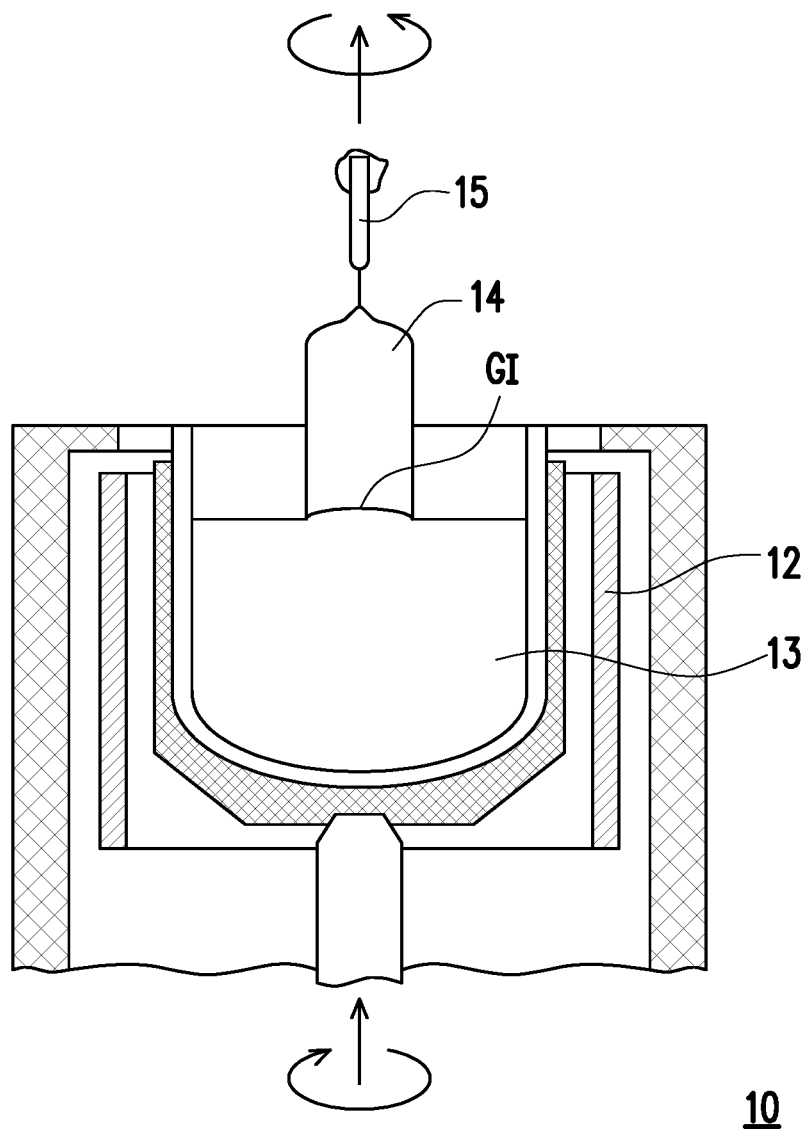
FIG. 1 is a schematic view of a conventional apparatus for growing a Si ingot single crystal by a Czochralski growth method (a CZ growth method).
Figure 2A:
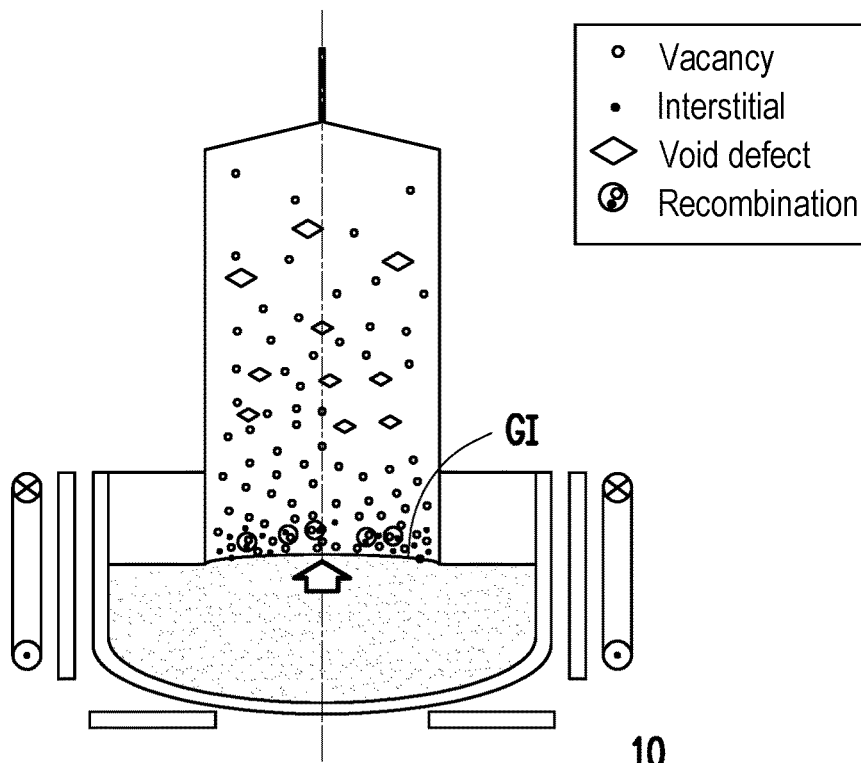
FIG. 2A is a schematic view illustrating the distribution of different point defects when a Si ingot single crystal is grown by the CZ growth method.
Figure 2B:
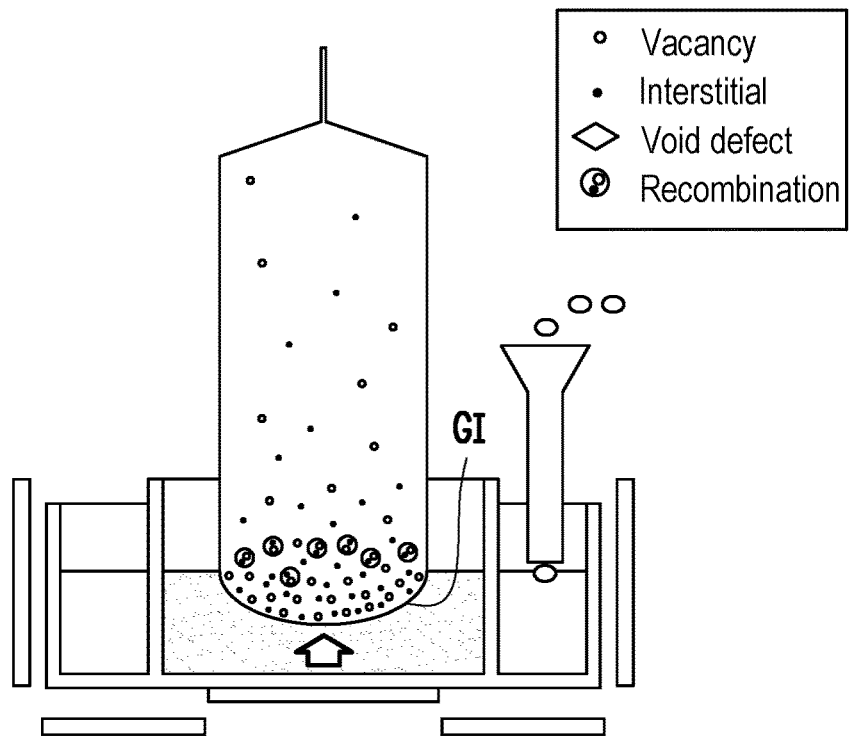
FIG. 2B is a schematic view illustrating the distribution of different point defects during the growth of the Si ingot single crystal by a noncontact crucible (NOC) growth method according to an embodiment of the disclosure.

FIG. 2A is a schematic view illustrating the distribution of different point defects when a Si ingot single crystal is grown by the CZ growth method, and FIG. 2B is a schematic view illustrating the distribution of different point defects during the growth of the Si ingot single crystal by the NOC growth method according to an embodiment of the disclosure. Referring to FIG. 2A, during the growth process of the CZ growth method, a growth interface GI is concave downward toward the Si ingot single crystal. Therefore, the impurities and $O_2$ are introduced from the growth interface. As shown in FIG. 2A, due to the large temperature gradient in the CZ growth method, the vacancies and interstitial Si atoms introduced from the growth interface quickly decrease. However, the vacancy concentration and the interstitial concentration have different decreasing curves varying along with the distance far away from the growth interface. As shown in FIG. 2A, when there is a rich vacancy concentration, the vacancy concentration accumulates and becomes a void defect at the crystal cooling stage.

On the other hand, referring to FIG. 2B, during the growth process of the NOC growth method, the growth interface GI is convex downward toward the Si melt. Therefore, the impurities and $O_2$ are moved away along the growth interface to the melt surface. Referring to FIG. 2B, during the growth process of the NOC growth method, vacancies and interstitial Si atoms are introduced under near equilibrium condition. Moreover, to annihilate vacancies and interstitial Si atoms, the pair-annihilation is performed on the vacancies and interstitial Si atoms in an attempt to achieve better equilibrium. As shown in FIG. 2B, the vacancy flux and the interstitial Si atoms flux are introduced into the Si ingot single crystal from the growth interface, and the vacancy flux and the interstitial Si atoms flux are compensated gradually for each other, and by deliberately controlling the mutual compensation between vacancy flux and interstitial Si atom flux, it is possible to implement nearly defect-free grown Si ingot single crystals reproducibly and universally. Especially the difference between both fluxes is constant at the steady-state. In the subsequent paragraphs, the relationship between the vacancy concentration and the interstitial concentration of the Si ingot single crystal during the crystal growth process is illustrated in the model developed.

Figure 3:
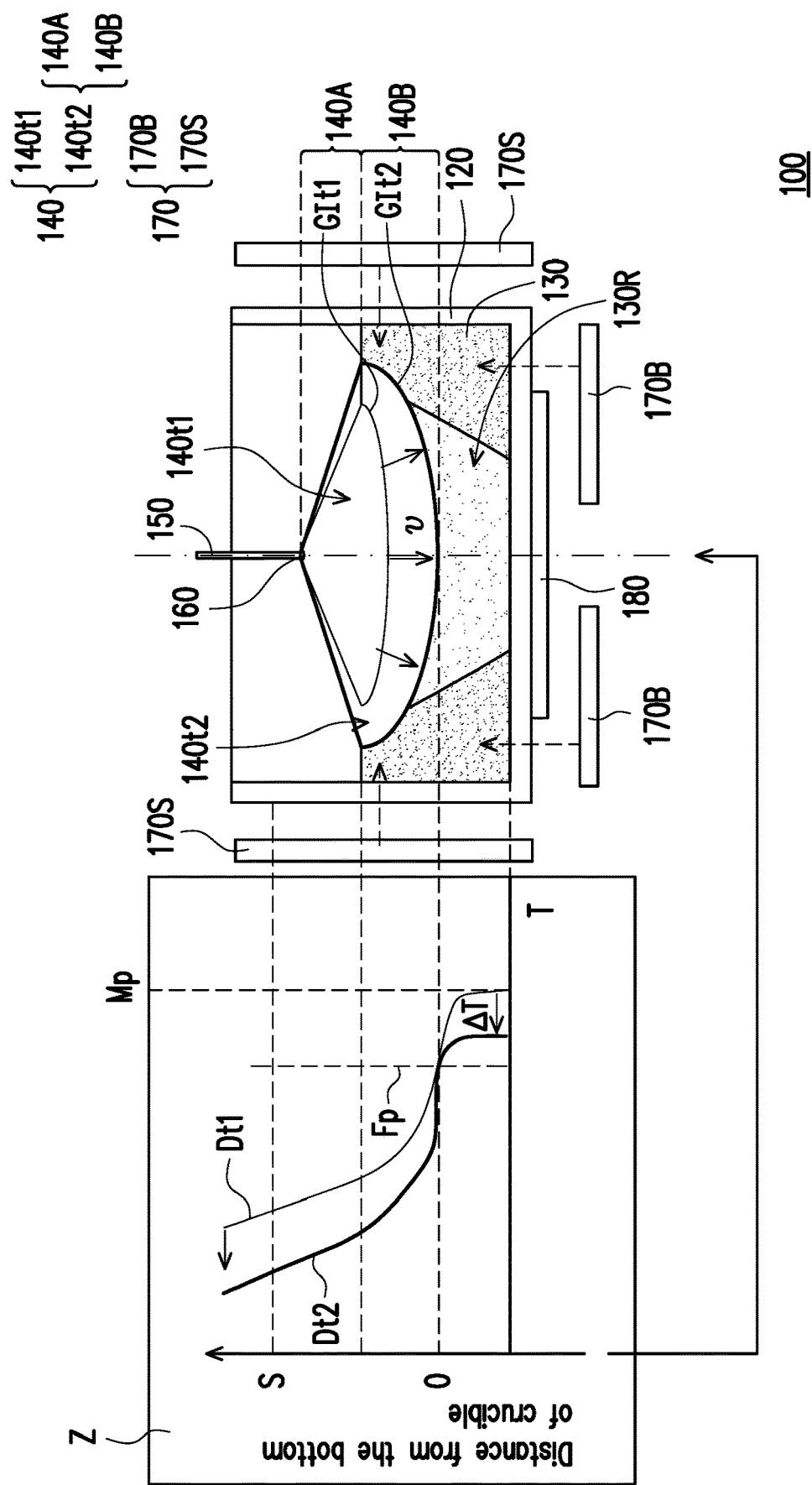
FIG. 3 is a schematic view illustrating the NOC growth method according to an embodiment of the disclosure.

FIG. 3 is a schematic view illustrating the NOC growth method according to an embodiment of the disclosure.

Referring to the right part of FIG. 3, in the embodiment, an apparatus 100 for growing a Si ingot single crystal by the NOC growth method includes a crucible 120, a Si melt 130 in a liquid state disposed in the crucible 120, a Si ingot single crystal 140 being grown in the Si melt 130, a pulling mechanism 150 pulling up a grown Si ingot single crystal, a seed crystal 160, and a temperature gradient controller 170. The Si ingot single crystal 140 grown for a first growth time is marked as a Si ingot single crystal 140t1, and the Si ingot single crystal 140 having been grown for a period of a second growth time is marked as a Si ingot single crystal 140t2 for better clarifying the method for producing the Si ingot single crystal of the disclosure and the apparatus thereof. Moreover, the left part of FIG. 3 correspondingly illustrates the temperature distribution of the Si melt 130 and the Si ingot single crystal 140 along a pulling axis direction. The X axis represents the temperature, and the Y axis represents a distance S from the bottom of the crucible along the pulling axis direction. As shown in the left part of FIG. 3, a temperature distribution Dt1 and a temperature distribution Dt2 represent the temperature distributions of the Si ingot single crystal 140t1 and the Si ingot single crystal 140t2 at different growth stages.

Referring to FIG. 3, in the apparatus 100 with the NOC growth method, the temperature gradient controller 170 including a bottom heater 170B and a side heater 170S may be used to dispose a thermal field structure in the Si melt 130, so that a larger area of a low temperature region 130R with a temperature lower than the temperature of the periphery of the crucible 120 is generated in the central portion of the crucible 120 in the Si melt 130. Specifically, in the low temperature region 130R, the temperature of the Si melt remains between the Si freezing point (Fp of approximately 1410° C.) and the Si melting point (Mp of approximately 1414° C.). The low temperature region 130R allows natural crystal growth inside. Moreover, FIG. 3 only schematically illustrates the low temperature region 130R, but its boundary is not limited thereto. For example, the low temperature region 130R in FIG. 3 extends to the bottom of the crucible 120, but in other embodiments, the low temperature region 130R may not be in contact with the bottom of the crucible 120, and the disclosure is not limited thereto.

Referring to FIG. 3, the seed crystal 160 is used on the surface of the Si melt 130 to generate nucleation, and the Si ingot single crystal 140 is grown within the Si melt 130 without contacting the wall of the crucible 120. For example, at a first time t1, the temperature distribution in the apparatus 100 for producing the Si ingot single crystal is controlled to be the temperature distribution Dt1 shown in the left part of FIG. 3 and to grow the Si ingot single crystal 140t1 as shown in the right part of FIG. 3. The position of the growth interface is a growth interface GIt1, for example. Subsequently, at a second time t2, the temperature in the system is decreased. For example, as shown in the left part of FIG. 3, the temperature distribution Dt1 is decreased by a temperature ΔT and becomes the temperature distribution Dt2 to grow the Si ingot single crystal 140t2 as shown in the right part of FIG. 3. Meanwhile, the position of the growth interface is a growth interface GIt2, for example. According to the above, during the growth process of the Si ingot single crystal 140, the growth interface GI is dynamically moving.

Next, the growing Si ingot single crystal 140 is slowly pulled up under the control of the pulling mechanism 150. As an example, the Si ingot single crystal 140t2 grown at the second time t2 is spatially divided into an upper part 140A of the Si ingot single crystal disposed above the surface of the Si melt 130 and a remaining Si ingot single crystal part 140B disposed inside the Si melt 130. In the method for producing a Si ingot single crystal of the disclosure, while the upper part 140A of the Si ingot single crystal above the Si melt surface is being pulled up, the remaining Si ingot single crystal part 140B is continuously grown in the low temperature region 130R. In some embodiments, the pulling rate of the pulling mechanism 150 for pulling up the grown Si ingot single crystal 140 may work with the growth rate of the remaining Si ingot single crystal part 140B in the low temperature region 130R.

With the Si ingot single crystal which is grown in the apparatus adopting the NOC growth method shown in FIG. 3 in the embodiment, it can be seen that the growth interface is convex downward no matter from which perspective the Si ingot single crystal is observed. Moreover, the diameter of the Si ingot single crystal 140 depends on the size of the low temperature region 130R in the Si melt 130. To implement such a large low temperature region, it is necessary to design the furnace to construct an optimal temperature distribution in the Si melt inside the thermal field. In the disclosure, the NOC growth method is defined as a growing method that intentionally establishes a significant low temperature region in the Si melt.

The NOC growth method of the disclosure has several novel features due to the main feature that the Si ingot single crystal can be grown within the Si melt without contacting the crucible wall. A large Si ingot single crystal with a diameter ratio of 0.9 is realized inside the Si melt, where the diameter ratio is the maximum diameter of the Si ingot single crystal divided by the diameter of the crucible. In one embodiment of the disclosure, a crucible with a diameter of 50 cm is used to obtain a Si ingot single crystal with a maximum diameter of 45 cm, which is illustrated in detail in Example 1 in the subsequent paragraphs. Moreover, due to the long-term diffusion from the growth interface to the surface of the Si melt in the hot ingot, it is speculated that the defect formation mechanism of the NOC growth method is very different from the defect formation mechanism of the CZ growth method.

After illustrating the NOC growth method of the disclosure with reference to FIG. 2A, FIG. 2B, and FIG. 3, the essential difference between the method for producing a Si ingot single crystal and the CZ growth method is explained more in details. In the NOC growth method, since the Si ingot single crystal 140 grows naturally in the Si melt 130 under close to equilibrium conditions, the growth rate is determined by the temperature gradient inside the horizontally and vertically expanded low-temperature region 130R, and the growth rate in the NOC growth method is not determined by the pulling rate of the Si ingot single crystal, which is very different from that in the CZ growth method. As the temperature gradient in the crystal becomes larger, the temperature gradient in the Si melt also becomes larger and the growth rate becomes lesser for the same amount of temperature reduction. Therefore, the temperature gradient and the growth rate change in the opposite direction. In the CZ growth method, as the pulling rate or the growth rate becomes greater, the temperature gradient in the crystal becomes smaller. In the CZ growth method, the temperature gradient G and the growth rate υ change in different directions. The pulling rare or growth rate determines the temperature gradient. In the NOC growth method, the temperature gradient G and the growth rate υ also change in different directions. The temperature gradient and cooling rate determine the growth rate. Therefore, when Si ingot single crystals are grown with the CZ and NOC growth methods, the parameter v/G is a meaningful and very useful process parameter. Thus. in the CZ growth method, G is determined by the pulling rate, but in the NOC growth method, G should be determined by controlling the temperature gradient controller 170 Based on the above finding, the defect formation mechanism of the NOC growth method is illustrated in more detail in the subsequent paragraphs, which serves as the foundation of the method for producing a Si ingot single crystal of the disclosure.

First, the relationship between the method for producing the Si ingot single crystal and the defect formation mechanism of the NOC growth method is illustrated.

Figure 4:
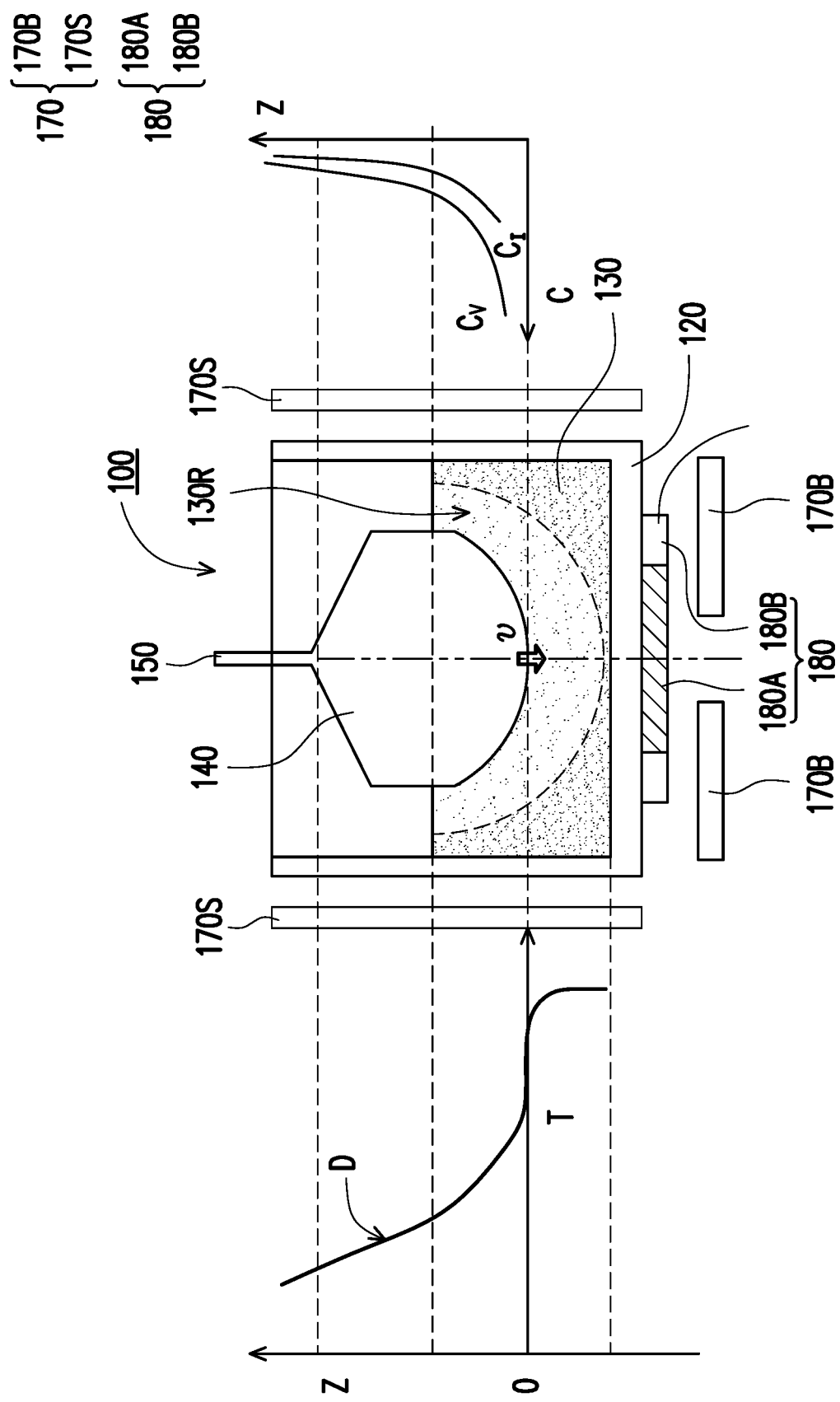
FIG. 4 is a schematic view illustrating an apparatus for growing a Si ingot single crystal according to an embodiment of the disclosure.

FIG. 4 is a schematic view illustrating an apparatus for growing a Si ingot single crystal according to an embodiment of the disclosure. In the noncontact crucible (NOC) growth method, a Si stress-less Si ingot single crystal with a large diameter and a large volume is grown without contacting the crucible wall. In order to realize such a large uniform Si ingot single crystal, an embodiment is illustrated in FIG. 4. In the embodiment, the apparatus 100 for growing a Si ingot single crystal by the NOC growth method includes the temperature gradient controller 170. The temperature gradient controller 170 includes the bottom heater 170B and the side heater 170S. In the embodiment, a large and deep low temperature region 130R can be effectively formed in the upper central portion of the Si melt 130 by using a thermal insulator 180A disposed under the bottom of the crucible 120. More specifically, the plate 180 below the crucible bottom contains both the thermal insulator 180A in its central portion and the graphite plate 180B in the periphery portion of the plate 180. The thermal insulator 180A may be a central portion with a lower thermal conductivity and the graphite plate 180B may be the periphery portion with a higher thermal conductivity surrounding the central portion; the thermal conductivity of the thermal insulator 180A in the central portion at the Si melting point substantially ranges from 0.15 W/mk to 0.55 W/mk, for example; and the thermal conductivity of the graphite plate 180B in the periphery portion at the Si melting point substantially ranges from 20 W/mk to 60 W/mk, for example.

As shown in FIG. 4, ultra-low defect (or defect-free) Si ingot single crystals can be efficiently and reproducibly grown by the NOC growth method appropriately according to the relationship between the concentrations of vacancies and interstitial Si atoms, the temperature gradient, and the growth rate constructed in the disclosure. More specifically, the relationship between the temperature distribution in the Si melt 130 and the distance Z from the growth interface may be illustrated as the temperature gradient distribution in the left part of FIG. 4. Specifically, the X axis of the temperature gradient view in the left part of FIG. 4 represents the temperature T, and the Y axis represents the distance Z from the growth interface along the pulling axis direction. According to the temperature gradient distribution in the left part of FIG. 4, when the Si ingot single crystal is grown by the NOC growth method, the temperatures T at different positions in the Si ingot single crystal 140 and the Si melt 130 vary along with the distance Z from the growth interface.

Moreover, according to the defect formation mechanism theory developed in the subsequent paragraphs, during the dynamic process of the Si ingot single crystal grown by the NOC growth method, the Si ingot single crystal 140 has a vacancy concentration distribution and an interstitial concentration distribution during the growth process in the right part of FIG. 4. The X axis in the right part of FIG. 4 represents the concentration, and the Y axis represents the distance Z from the growth interface along the pulling axis direction. According to the concentration gradient distribution in the right part of FIG. 4, the distribution of the vacancy concentration $C_V$ and the distribution of the interstitial concentration $C_I$ of the Si ingot single crystal 140 respectively decrease with the increase of the distance Z from the growth interface. In the embodiment, the concentration distribution in the right part of FIG. 4 is only one exemplary implementation. Descriptions of how the distribution of the vacancy concentration $C_V$ and the distribution of the interstitial concentration $C_I$ of the Si ingot single crystal 140 vary with the distance Z or vary with the temperature gradient G, and multiple implementations are illustrated in detail in the mechanism constructed in the subsequent paragraphs.

Based on the above, in the method for producing the Si ingot single crystal in the disclosure as shown in FIG. 4, ultra-high-quality Si ingot single crystals are produced by the NOC growth method based on the constructed distribution of the vacancy concentration $C_V$ and the interstitial concentration $C_I$ and the relationship between the temperature gradient G and the growth rate υ.

Moreover, the Si ingot single crystal is grown within the Si melt, so the temperature distribution and temperature gradient in the Si ingot single crystal grown by the NOC growth method are very different from those in the Si ingot single crystal grown by the CZ growth method. Through the point defect concentration distribution theory of the NOC growth method developed by the inventors illustrated in the subsequent paragraphs, it can be clearly seen that different temperature distributions and different temperature gradients can be expected to produce different distributions of point defects (e.g., vacancies and interstitial Si atoms) in Si ingot single crystals grown by the NOC growth method. However, research on the concentration distribution of such point defects in Si ingot single crystals grown by the NOC growth method is absent in the related art.

To clarify the concentration distribution of point defects in the Si ingot single crystal grown by the NOC growth method, a simple simulation model based on the Voronkov and Faister model is proposed. In the model, the influence of the accumulation of diffusion fluxes of both vacancies and interstitial Si atoms on their concentrations is taken into account and is used in the NOC growth method, because these diffusion fluxes are under a relatively mild temperature gradient inside the Si melt and may continue to affect their concentrations in the Si ingot single crystal that is grown on the moving interface. After the dynamically balanced pair-annihilation among the diffused point defects in the growth process, the vacancy concentration and the interstitial concentration are also calculated. The calculated distance is a function of the distance from the growth interface. By selecting the growth conditions, it is found that each of the vacancy and interstitial concentrations on the entire Si ingot single crystal is very close to one another especially near the critical point in which diffusion fluxes of both vacancies and interstitial Si atoms are same.

The inventors of the disclosure have devoted to research on the above problems and developed a complete simulation model of the NOC growth method in a dynamic equilibrium, which can more accurately control the process parameters that may affect the point defects in the NOC growth method. Accordingly, the universality and versatility of the NOC growth method can be realized, and an ultra-low concentration defect Si ingot single crystal with almost no defects can be grown. In the subsequent paragraphs, the relationship between the diffusion fluxes and point defects in the NOC growth method developed by the inventors is illustrated.

Regarding the above technical problems, the inventors performed theoretical models and calculations for the NOC growth method as follows.

(1) First, a distribution model of equilibrium vacancies and interstitial atoms of the Si ingot single crystal grown in the NOC growth method is developed as follows.

According to the aforementioned characteristics of the NOC growth method, the model is proposed to simply calculate the distribution of point defects in the ingots grown by the NOC growth method. In the model, it is assumed that the point defect is in a thermal equilibrium state at the growth interface, and there is not a sink of point defect in the ideal pure silicon crystal. Under equilibrium conditions, the free growing interface may continuously provide vacancies and interstitial Si atoms.

Regarding the Si ingot single crystal grown by the CZ growth method, the temperature T (K) in the crystal can be simply expressed by a function of the distance z (in unit of cm) from the growth interface as shown in the following formula (1):

$$1/T - 1/T_m = Gz/T_m^2, \quad (1)$$

where Tm (=1687 K) is the Si melting point, and the temperature gradient G (K/cm) is the temperature gradient in the crystal. Here, this expression is called as Voronkov's profile.

In this case, the equilibrium vacancy concentration of $C_V^{eq}(z)$ (cm$^{-3}$) can be expressed by the following formula (2):

$$C_V^{eq}(z) = C_{V\,mp}^{eq} \exp(-E_V^f Gz/k_B T_m^2) \quad (2)$$

where according to formula (1), $C_V^{eq}(z)$ is equal to $C_V^{eq}(T)$, $C_{V\,mp}^{eq}$ is the equilibrium vacancy concentration when the growth interface is Tm, $E_V^f$(ev) is the formation energy of vacancies, and $k_B$ is Boltzmann's constant (=1.38× 10$^{-16}$ erg K$^{-1}$). Similarly, the equilibrium interstitial concentration $C_I^{eq}(z)$ can be expressed by the following formula (3):

$$C_I^{eq}(z) = C_{I\,mp}^{eq} \exp(-E_I^f Gz/k_B T_m^2) \quad (3)$$

where according to formula (1), $C_I^{eq}(z)$ is equal to $C_I^{eq}(T)$, $C_{I\,mp}^{eq}$ is the equilibrium concentration of the interstitial concentration at the growth interface, and $E_I^f$(ev) is the formation energy of the interstitial Si atoms. The vacancy fluxes and the interstitial Si atom fluxes $J_V^{eq}(z)$ and $J_I^{eq}(z)$, under equilibrium conditions, can be expressed by the following formulae (4) and (5), respectively:

$$J_V^{eq}(z) = -D_{V\,mp} \partial C_V^{eq}(z)/\partial z + v C_{V\,mp}^{eq}, \quad (4)$$

$$J_I^{eq}(z) = -D_{I\,mp} \partial C_I^{eq}(Z)/\partial z + v C_{I\,mp}^{eq}, \quad (5)$$

In formulae (4) and (5), $D_{V\,mp}$ and $D_{I\,mp}$ (cm$^2$ s$^{-1}$) are the diffusion constants of vacancies and the diffusion constants of interstitial Si atoms, and v (cm$^{s-1}$) is the growth rate. The first term corresponds to diffusion, while the second term corresponds to defect transportation through moving growth interface.

Regarding the Si ingot single crystals grown by the NOC growth method, it is simply assumed that the temperature T (K) in the crystals is a function of the distance z (in unit of cm) from the growth interface in a form of a long temperature profile and a variable temperature gradient as expressed in the following formula (6):

$$1/T - 1/T_m = 1/(T_m - Gz) - 1/T_m = Gz/T_m(T_m - Gz), \quad (6)$$

where the temperature gradient G is expressed by the following formula (7). Here, this expression is called as the Linear T profile.

$$G = (T_m - T)/z(\text{K/cm}). \quad (7)$$

Under the temperature distribution shown in formula (6), $$C_V^{eq}(z)/C_{V\,mp}^{eq} = \exp(-E_V^f/(k_BT))/\exp(-E_V^f/k_BT_m) = \exp\{-(E_V^f/k_B)(1/T - 1/T_m)\} = \exp\{-(E_V^f/k_B)(Gz/T_m(T_m-Gz))\} \quad (8)$$

According to formula (8), $$C_V^{eq}(z) = C_{V\,mp}^{eq}\exp\{-(E_V^f/k_B)(Gz/T_m(T_m-Gz))\}, \quad (9)$$

Similarly, $$C_I^{eq}(z) = C_{I\,mp}^{eq}\exp\{-(E_I^f/k_B)(Gz/T_m(T_m-Gz))\} \quad (10)$$

Formulae (9) and (10) can be used to express the equilibrium fluxes $J_V^{eq}(z)$ and $J_I^{eq}(z)$ of vacancies and interstitial Si atoms grown by the NOC growth method:

$$J_V^{eq}(z) = -D_{V\,mp}\partial C_V^{eq}(z)/\partial z + vC_V^{eq}(z) = J_V^{eq\,D}(z) + vC_V^{eq}(z), \quad (11)$$

$$J_I^{eq}(z) = -D_{I\,mp}\partial C_I^{eq}(z)/\partial z + vC_I^{eq}(z) = J_I^{eq\,D}(z) + vC_I^{eq}(z), \quad (12)$$

(2) The Distribution Model of Concentrations of Vacancies and Interstitial Si Atoms in the Si Ingot Single Crystal Grown by the NOC Growth Method after the Pair-Annihilation During the growth process, by the pair-annihilation, the vacancy concentration and the interstitial concentration in the Si ingot single crystal are reduced. When the dynamic equilibrium of the pair-annihilation is always maintained at 1250° C. or higher temperature in the Si ingot single crystal, under equilibrium conditions, the process can be expressed as follows:

$$C_V(z)C_I(z) = C_V^{eq}(z)C_I^{eq}(z), \quad (13)$$

In the formula (13), $C_V(z)$ and $C_I(z)$ are the vacancy concentration and the interstitial concentration respectively after the pair-annihilation. In the calculation, the activation barrier is not considered for the annihilation reaction.

Regarding the Si ingot single crystal grown by the CZ growth method using Voronkov's profile, $C_V(z)$ and $C_I(z)$ can be expressed by formulae (2), (3), and (13):

$$C_V(z)C_I(z) = C_{V\,mp}^{eq}C_{I\,mp}^{eq}\exp{-(E_V^f+E_I^f)Gz/k_BT_m^2}. \quad (14)$$

According to formula (14), $C_V(z)$ and $C_I(z)$ are assumed as follows:

$$C_V(z) = C_{V\,mp}^{eq}\exp(-z/2L) \quad (15)$$

$$C_I(z) = C_{I\,mp}^{eq}\exp(-z/2L) \quad (16)$$

where $$1/L = (E_V^f+E_I^f)G/k_BT_m^2 \quad (17)$$

These relations roughly hold near the critical point in which diffusion fluxes of both vacancies and interstitial Si atoms are same, and they exactly hold at the critical point.

Regarding the Si ingot single crystal grown by the NOC growth method using the Linear T profile, $C_V(z)$ and $C_I(z)$ can be expressed by formulae (9), (10), and (13):

$$C_V(z)C_I(z) = C_{V\,mp}^{eq}C_{I\,mp}^{eq}\exp[-(E_V^f+E_I^f)Gz/\{k_BT_m(T_m-Gz)\}] \quad (18)$$

Having the same assumptions as those of formulae (15) and (16), $C_V(z)$ and $C_I(z)$ can be expressed as follows:

$$C_V(z) = C_{V\,mp}^{eq}\exp[-z/2L'(T_m-Gz)] \quad (19)$$

$$C_I(z) = C_{I\,mp}^{eq}\exp[-z/2L'(T_m-Gz)] \quad (20)$$

where $$1/L' = (E_V^f+E_I^f)G/k_BT_m \quad (21)$$

These relations roughly hold near the critical point in which diffusion fluxes of both vacancies and interstitial Si atoms are same, and they exactly hold at the critical point.

Figure 5:
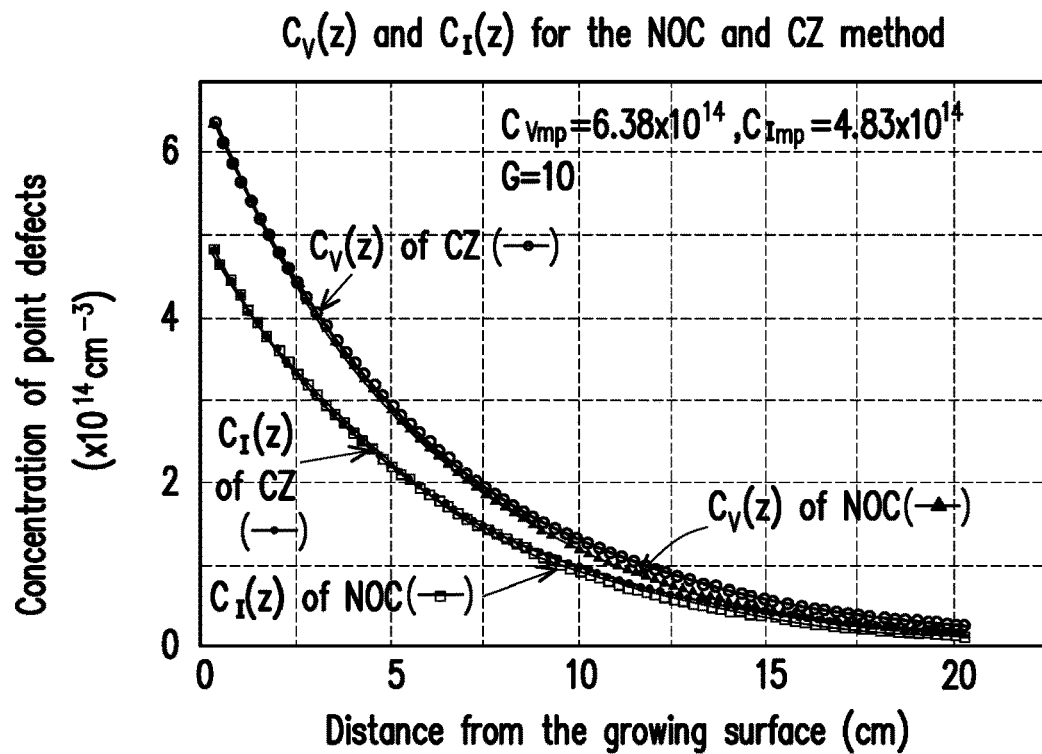
FIG. 5 illustrates the concentration distributions of $C_V(z)$ and $C_I(z)$ varying along with the distance from the growth interface when the temperature gradient is 10 K cm$^{-1}$ in the CZ growth method and the NOC growth method.

$C_V(z)$ and $C_I(z)$ use formulae (19) and (20) to simulate the vacancy concentration and interstitial concentration in the NOC growth method, and use formulae (15) and (16) to simulate the vacancy concentration and interstitial concentration in the CZ growth method as shown in FIG. 5. In the calculation, the parameters used are based on Nakamura's doctoral thesis (K. Nakamura, S. Maeda, S. Togawa, T. Saishoji, J. Tomioka, High Purity Silicon VI, PV2000-17, (2000) 31.) and the thesis (K. Nakamura, Doctoral thesis for Tohoku University, "Study of Diffusion of Point Defects in a Single Crystal of Silicon during Growth Process and Formation of Secondary Defects", chapter 3, Table 3-5, 2002.). The parameters are listed in Table 1:

TABLE 1

| | |
|---|---|
| $C_{V\,mp}^{eq} = 6.38 \times 10^{14}$ cm$^{-3}$ | $D_{V\,mp}C_{V\,mp}^{eq} = 2.87 \times 10^{10}$ cm$^{-1}$ s$^{-1}$ |
| $C_{I\,mp}^{eq} = 4.83 \times 10^{14}$ cm$^{-3}$ | $D_{I\,mp}C_{I\,mp}^{eq} = 2.41 \times 10^{11}$ cm$^{-1}$ s$^{-1}$ |
| $D_{V\,mp} = 4.5 \times 10^{-5}$ cm$^2$ s$^{-1}$ | $E_V^f = 3.94$ eV |
| $D_{I\,mp} = 5.10 \times 10^{-4}$ cm$^2$ s$^{-1}$ | $E_I^f = 4.05$ eV |

FIG. 5 illustrates the concentration distributions of $C_V(z)$ and $C_I(z)$ varying along with the distance from the growth interface when the temperature gradient is 10 K cm$^{-1}$ in the CZ growth method and the NOC growth method. In the embodiment, for the growth in the NOC growth method and the CZ growth method, the temperature gradient G is fixed at G=10 K cm$^{-1}$. As shown in FIG. 5, the $C_V(z)$ and $C_I(z)$ in the CZ growth method are slightly greater than the $C_V(z)$ and $C_I(z)$ in the NOC growth method because the influence of $(T_m-Gz)$ in formulae (19) and (20) makes the influence of $C_V(z)$ and $C_I(z)$ greater than the value of the constant $T_m$ in formulae (15) and (16) along with the increase of the growth of the Si ingot single crystal. According to FIG. 5, in both the NOC growth method and the CZ growth method, $C_V(z)$ is always greater than $C_I(z)$ in the Si ingot single crystal, and both $C_V(z)$ and $C_I(z)$ decrease to zero. The difference between $C_V(z)$ and $C_I(z)$ becomes less as the Si ingot single crystal grows due to their mutual pair-annihilation.

Figure 6:
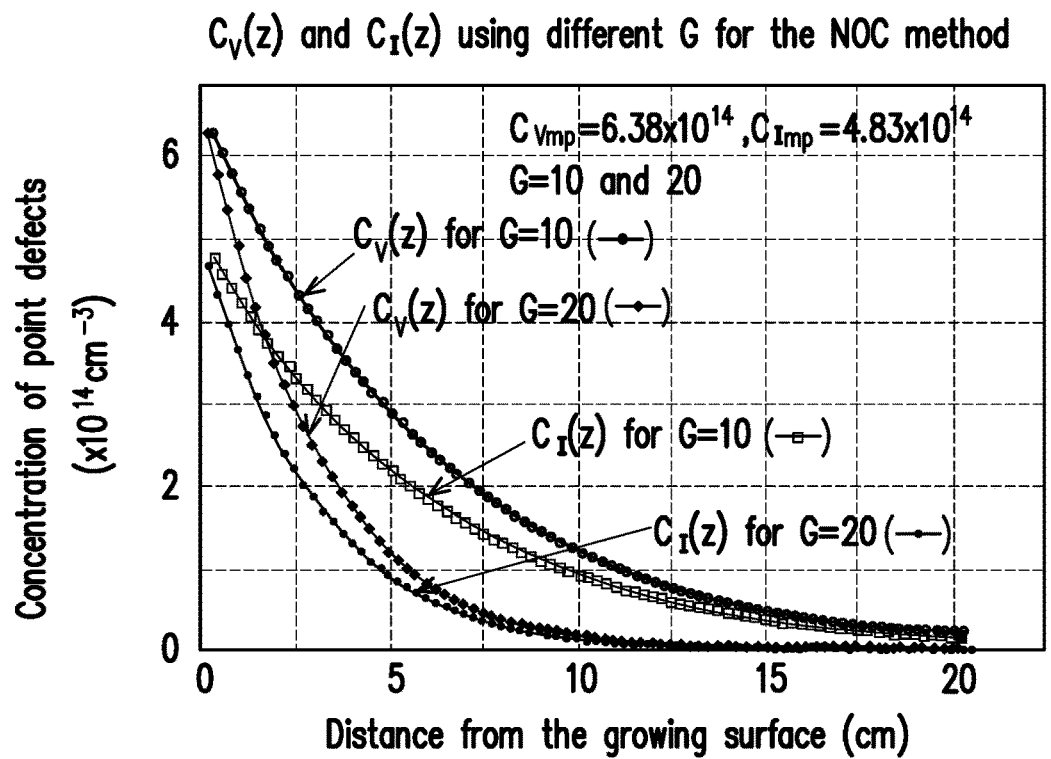
FIG. 6 illustrates the concentration distributions of $C_V(z)$ and $C_I(z)$ varying along with the distance from the growth interface when different temperature gradients G are used in the NOC growth method.

FIG. 6 illustrates the concentration distributions of $C_V(z)$ and $C_I(z)$ varying along with the distance from the growth interface when different temperature gradients G are used in the NOC growth method. In FIG. 6, G=10 and G=20 K cm$^{-1}$ respectively are used to calculate $C_V(z)$ and $C_I(z)$. According to FIG. 6, as the temperature gradient G increases, both $C_V(z)$ and $C_I(z)$ may decrease faster. Moreover, as the Si ingot single crystal grows, the difference between $C_V(z)$ and $C_I(z)$ decreases a lot and finally becomes almost equal as the distance from the growth interface increases.

(3) The Influence of the Accumulation of Diffusion Fluxes on the Distribution of Vacancies in Si Ingot Single Crystals and the Distribution of Interstitial Si Atoms Grown by the NOC Growth Method In the NOC growth method, the Si ingot single crystal is grown by moving the interface, and the growth interface grows in the Si melt at a growth rate υ. Moreover, the temperature distribution of the Si ingot single crystal inside the melt in the NOC growth method is relatively mild compared to that outside the melt in the CZ growth method. This growth mechanism produces a certain degree of accumulation or convention of vacancy and interstitial Si atom diffusion fluxes in the Si ingot single crystal, which is defined as $J_{V\,or\,I}{}^{D}(z)/v$ (cm$^{-3}$). The accumulation term or the convection term is related to point defect transportation due to diffusion fluxes constantly flown in from the moving interface.

Under equilibrium conditions, the freely growing interface may continuously provide or consume vacancies and interstitial Si atoms under near-equilibrium condition. In this case, for the NOC growth method, the influence of the diffusion fluxes of the vacancies and the interstitial Si atoms on their concentrations should be considered because it can be expected that the diffusion fluxes may accumulate and continue to affect their concentrations in a Si ingot single crystal grown under a relatively mild temperature gradient inside the Si melt. After the pair-annihilation performed on each equilibrium point defect, based on formulas (11) and (12), the vacancy diffusion flux $J_V{}^D(z)$ and the interstitial Si atom diffusion flux $J_I{}^D(z)$J can be expressed as follows:

$$J_V^D(z) = -D_{V\,mp}\partial C_V(z)/\partial z = (D_{V\,mp}C_{V\,mp}^{eq}T_m/2L')g(z) \quad (22)$$

$$J_I^D(z) = -D_{I\,mp}\partial C_I(z)/\partial z = (D_{I\,mp}C_{I\,mp}^{eq}T_m/2L')g(z) \quad (23)$$

where $$g(z) = \exp[-z/\{2L'(T_m - Gz)\}]/(T_m - Gz)^2 \quad (24)$$

In this case, by using the concentrations after the pair-annihilation, the $C_V{}^{eq}(z)$ shown in formulae (4) and (5) and equal to $C_I{}^{eq}(z)$ is replaced with $C_V(z)$ equal to $C_I(z)$.

Figure 7:
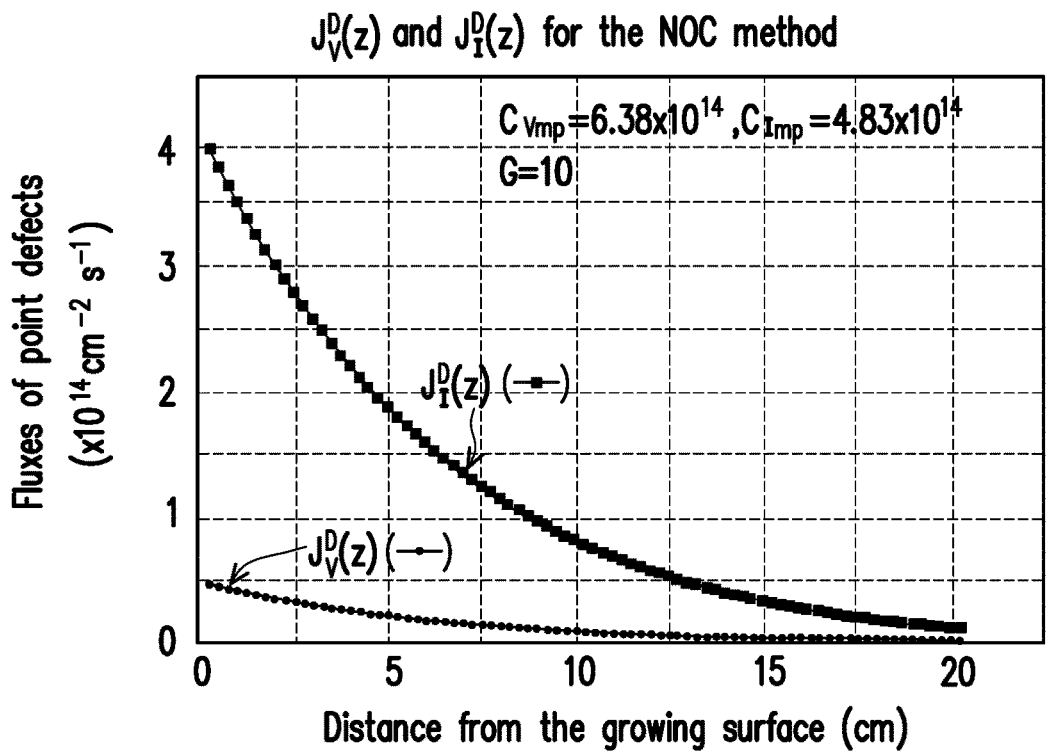
FIG. 7 illustrates the diffusion flux distributions of $J_V^D(z)$ and $J_I^D(z)$ varying along with the distance from the growth interface when the temperature gradient is 10 K cm$^{-1}$ in the CZ growth method and the NOC growth method.

According to formulae (21) to (24), the calculation results of $J_V{}^D(z)$ and $J_I{}^D(z)$ are shown in FIG. 7. FIG. 7 illustrates the diffusion flux distributions of $J_V{}^D(z)$ and $J_I{}^D(z)$ varying along with the distance from the growth interface when the temperature gradient is 10 K cm$^{-1}$ in the NOC growth method. Regarding the calculation, the temperature gradient G is fixed at G=510 K cm$^{-1}$. As shown in FIG. 7, in the initial stage of growth, $J_V{}^D(z)$ is much greater than $J_I{}^D(z)$, and $J_I{}^D(z)$ is the dominant diffusion flux. As the Si ingot single crystal grows, $J_I{}^D(z)$ decreases rapidly, and as the distance from the growth increases, the difference between $J_V{}^D(z)$ and $J_I{}^D(z)$ becomes less. Finally, in this case, near z=20 cm, the fluxes of both the vacancies and the interstitial Si atoms becomes relatively less.

The accumulation concentrations of the vacancies and the interstitial Si atoms introduced by diffusion in the Si ingot single crystal during the growth by the moving interface can be defined as $C_V{}^J(z)$ and $C_I{}^J(z)$. $C_V{}^J(z)$ and $C_I{}^J(z)$ can be expressed by using each diffusion flux as follows:

$$C_I^J(z) = J_V^D(z)/v = (D_{V\,mp}C_{V\,mp}^{eq}T_m/2vL')g(z) \quad (25)$$

$$C_I^J(z) = J_I^D(z)/v = (D_{I\,mp}C_{I\,mp}^{eq}T_m/2vL')g(z) \quad (26)$$

The total vacancy concentration is obtained by adding $C_V{}^J(z)$ and $C_I{}^J(z)$, which can serve as the equilibrium concentrations of the vacancies and the interstitial Si atoms after the pair-annihilation of the point defects in the thermal equilibrium state. When the pair-annihilation of diffused point defects is not taken into account, interstitial Si atoms $C_V{}^{Total}(z)$ and $C_I{}^{Total}(z)$ in the Si ingot single crystal grown by the NOC growth method can be expressed as follows:

$$C_V^{Total}(z) = C_V^J(z) + C_V(z) \quad (27)$$

$$C_I^{Total}(z) = C_I^J(z) + C_I(z) \quad (28)$$

Here, the $vC_V{}^{eq}(z)$ and $vC_I{}^{eq}(z)$ in formulae (11) and (12) are not considered for the calculation of the $C_V{}^{Total}(z)$ and $C_I{}^{Total}(z)$ in the NOC growth method because the unstable redundant items seem to quickly disappear near the growing interface under near equilibrium condition.

Figure 8:
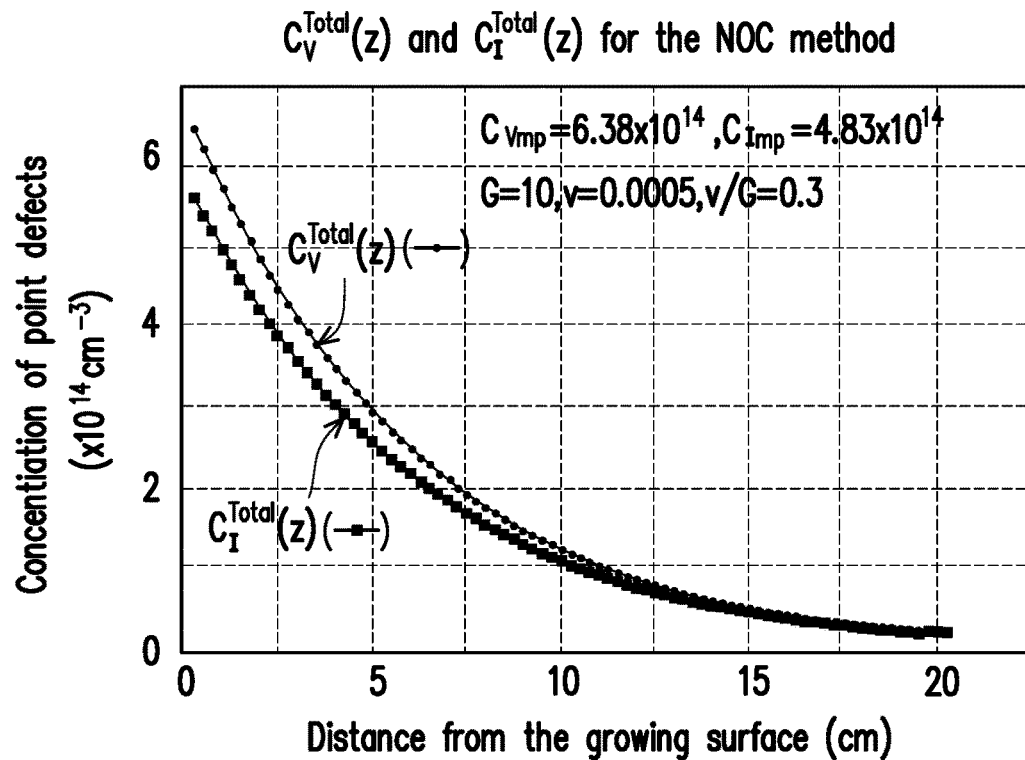
FIG. 8 illustrates the concentration distributions of $C_V^{Total}(z)$ and $C_I^{Total}(z)$ varying along with the distance from the growth interface when the temperature gradient is 10 K cm$^{-1}$ in the NOC growth method.

The calculation results of formula (19), formula (20), formula (25), formula (26), formula (27), and formula (28) are shown in FIG. 8. FIG. 8 illustrates the concentration distributions of the $C_V{}^{Total}(z)$ and $C_I{}^{Total}(z)$ varying along with the distance from the growth interface when the temperature gradient is 10 K cm$^{-1}$ in the NOC growth method. In this calculation, the temperature gradient G and the growth rate υ are fixed as G=10 K cm$^{-1}$, v=0.0005 cm s$^{-1}$, and v/G=0.3 mm2 k$^{-1}$s$^{-1}$. As shown in FIG. 8, in the initial stage of growth, the $C_V{}^{Total}(z)$ is greater than the $C_I{}^{Total}(z)$. As the distance from the growth interface increases, both total concentrations decrease rapidly, and the difference between the two becomes less. In other words, the concentrations of the $C_V{}^{Total}(z)$ and $C_I{}^{Total}(z)$ both come near to each other as the distance increases and also both approach to the X axis. Both remained concentrations become relatively low near z=20 cm. Compared to the $C_I(z)$ in FIG. 5, the $C_I{}^{Total}(z)$ in FIG. 8 is greatly increased. This means that compared to the $C_V{}^J(z)$, the $C_I{}^J(z)$ is much greater, and most of the diffusion fluxes are dominated by the $C_I{}^J(z)$. This is a major advantage of the NOC growth method.

(4) The Concentration Distributions of the Diffused Vacancies and the Interstitial Si Atoms in the Si Ingot Single Crystal after the Pair-Annihilation in the NOC Growth Method During the growth process, the pair-annihilation may also occur in the Si ingot single crystal, so that both $C_V{}^J(z)$ and $C_I{}^J(z)$ become less because two point defects corresponding to each of the diffusion fluxes are also annihilated in the growth process. In this model, it is estimated that the effect of the pair-annihilation on the diffused point defects is as strong as possible.

As shown in FIG. 7, the diffusion flux of the interstitial Si atoms is much greater than that of the vacancies. In the pair-annihilation, the first step of producing a remained minimum concentration $\gamma(z)$ of the interstitial Si atoms at z can be expressed as:

$$\gamma(z) = C_I^J(z) - C_V^J(z), \quad (29)$$

where, $C_I{}^J(z) > C_V{}^J(z)$ can be expressed by formula (25) and formula (26). In this case, the interstitial Si atoms survive, and the vacancies quickly decrease. Therefore, the first step of the pair-annihilation is calculated as its maximum advanced process.

In the second step of the pair-annihilation, $\gamma(z)$ is used, and the vacancy concentration is further reduced by $\delta(z)$. Since the pair-annihilation occurs in equilibrium, the following relationship is constituted by the law of mass action:

$$\{C_V(z) - \delta(z)\}\{C_I(z) + \gamma(z)\}C_V(z)C_I(z). \quad (30)$$

From formula (30), $\delta(z)$ can be obtained under $\gamma(z)\delta(z)=0$:

$$\delta(z) = \gamma(z)C_V(z)/C_I(z). \quad (31)$$

After the pair-annihilation, $C_V(z)$ and $C_I(z)$ are expressed by $$C_V^R(z)=C_V(z)-\delta(z), \quad (32)$$

$$C_I^R(z)=C_I(z)+\gamma(z), \quad (33)$$

where $C_V^R(z)$ and $C_I^R(z)$ respectively show the true concentration of vacancies and the true interstitial concentration during the pair-annihilation performed on the diffused point defects.

Figure 9:
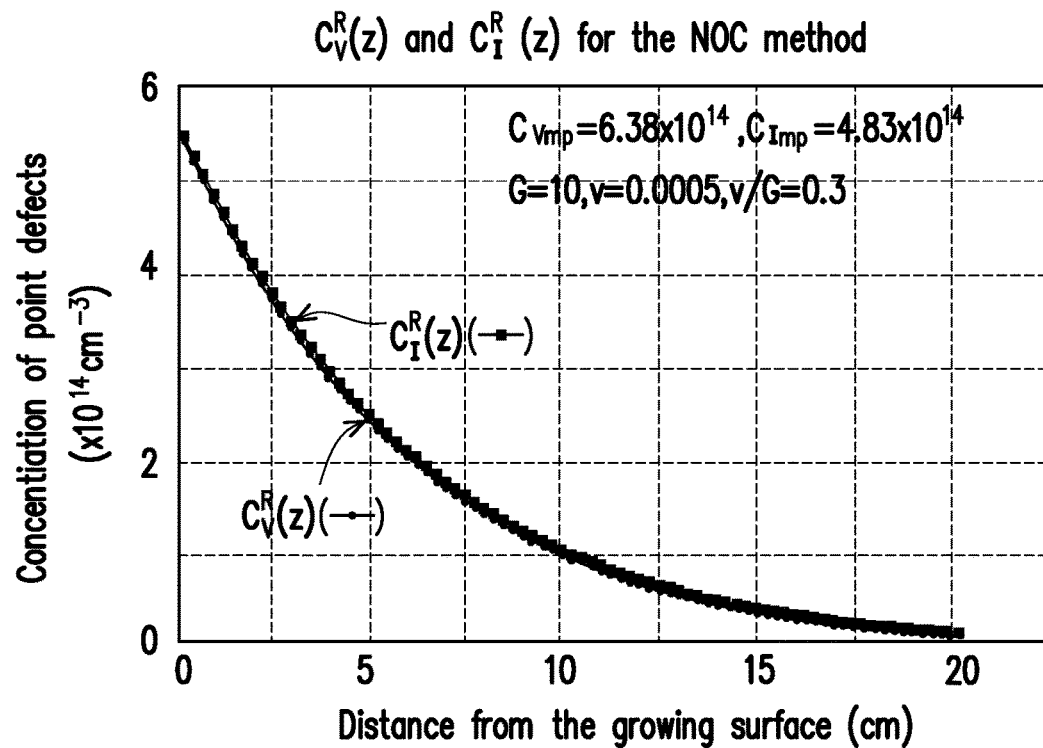
FIG. 9 illustrates the concentration distributions of $C_V^R(z)$ and $C_I^R(z)$ varying along with the distance from the growth interface when the temperature gradient is 10 K cm$^{-1}$ in the NOC growth method.

For the calculation of $C_V^R(z)$ and $C_I^R(z)$, substitute formula (19), formula (20), formula (25), formula (26), formula (29), and formula (31) into formula (32) and formula (33). Some calculation software such as Excel are adopted to facilitate the calculation of $C_V^R(z)$ and $C_I^R(z)$. The calculation results of $C_V^R(z)$ and $C_I^R(z)$ are shown in FIG. 9. FIG. 9 illustrates the variations of the positions of the vacancy concentration and the interstitial concentration from the growth interface along the crystal axis direction when the diffusion fluxes of the vacancies and the interstitial Si atoms are pair-annihilated during the growth process at the critical point. For this calculation, the temperature gradient G and the growth rate υ are fixed at G=10 K cm$^{-1}$ and υ=0.0005 cm s$^{-1}$. Compared to FIG. 8, due to the pair-annihilation of the diffused elements of the point defects, the vacancy concentration and the interstitial concentration are almost similarly reduced. The difference between the vacancy concentration and the interstitial concentration becomes relatively less throughout the Si ingot single crystal. $C_V^R(z)$ and $C_I^R(z)$ may vary greatly due to the temperature gradient G. For a lesser temperature gradient G, $C_V^R(z)$ becomes located at the upper side of $C_I^R(z)$. On the other hand, for a greater temperature gradient G, $C_V^R(z)$ becomes located at the lower side of $C_I^R(z)$. Moreover, $C_V^R(z)$ and $C_I^R(z)$ may vary greatly due to the growth rate υ. For a lesser growth rate υ, $C_V^R(z)$ becomes located at the lower side of $C_I^R(z)$. On the other hand, for a greater growth rate υ, $C_V^R(z)$ becomes located at the upper side of $C_I^R(z)$.

Figure 10:
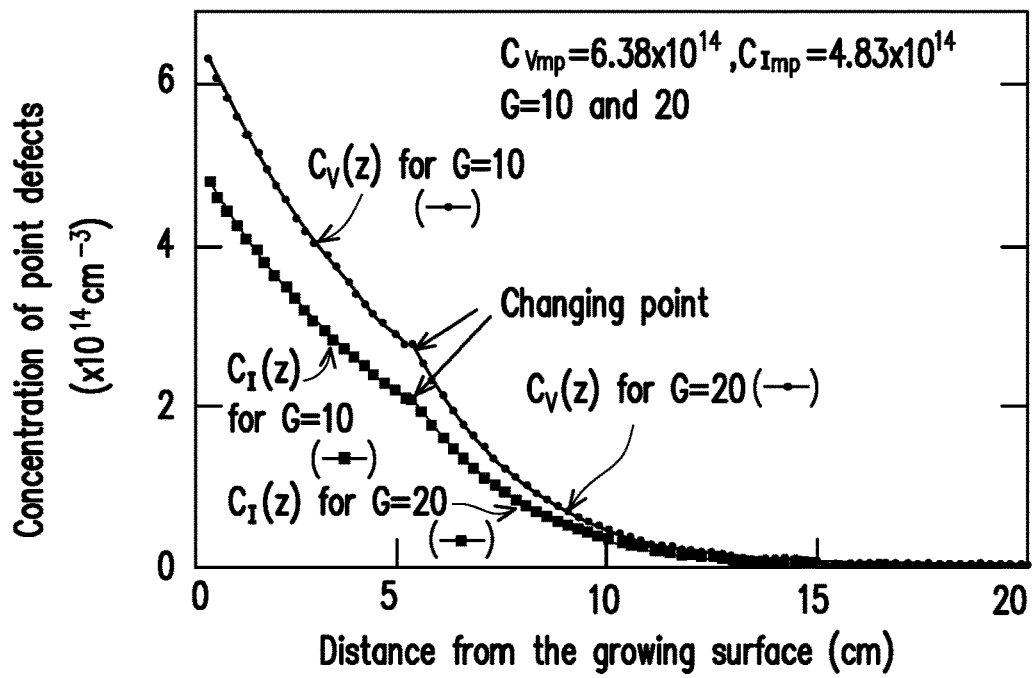
FIG. 10 illustrates $C_V(z)$ and $C_I(z)$ using temperature gradients G=10 and G=20 K cm$^{-1}$ in the two growth stages for the NOC growth method.
Figure 11:
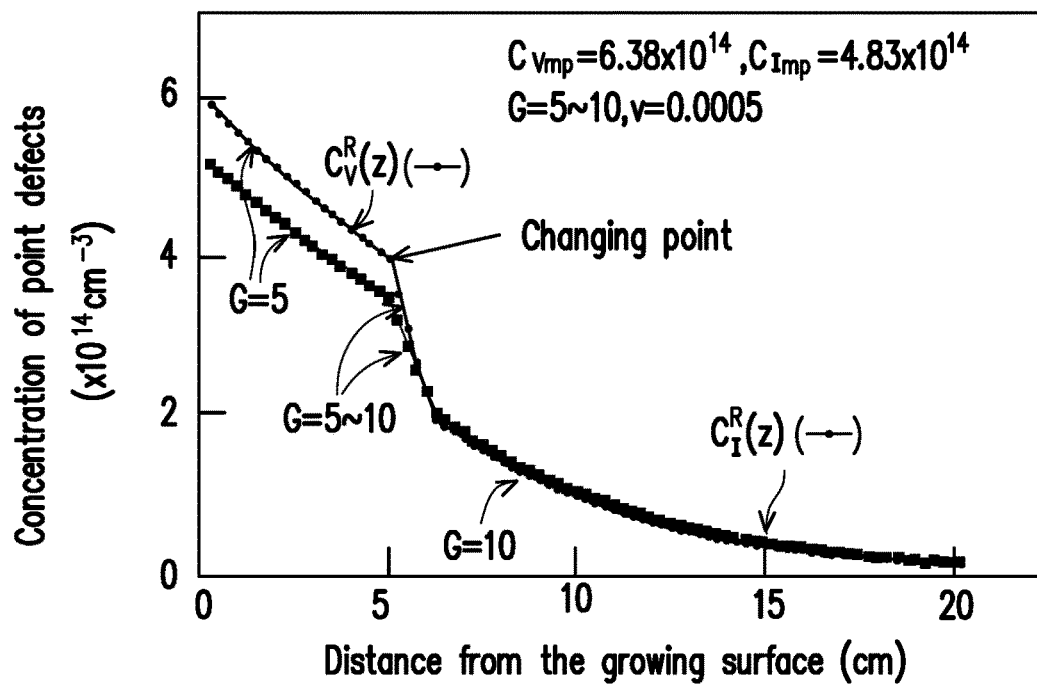
FIG. 11 illustrates the $C_V^R(z)$ and $C_I^R(z)$ in variable growth stages from G=5 K cm$^{-1}$ to 10 K cm$^{-1}$ for the NOC growth method.

(5) The Concentration Distributions of Two Temperature Gradients G During the Growth Process in the NOC Growth Method In the Si ingot single crystal grown by the NOC growth method, the temperature gradient changes near the surface of the Si melt because the Si ingot single crystal is moved outside the Si melt to the gas phase at the stage. As shown in FIG. 6, the temperature gradient affects the concentration distribution of point defects in the Si ingot single crystal greatly. Therefore, the concentration distribution of point defects changes near the surface position of the Si melt. FIG. 10 illustrates $C_V(z)$ and $C_I(z)$ using temperature gradients G=10 and G=20 K cm$^{-1}$ in the two growth stages for the NOC growth method. At the changing point, for $C_V(z)$ and $C_I(z)$, each concentration or each melting temperature of $C_V(z)$ for G=10 and G=20 K cm$^{-1}$ are the same value, and each concentration or each melting temperature of $C_I(z)$ for G=10 and G=20 K cm$^{-1}$ are the same value. Both concentrations of $C_V(z)$ and $C_I(z)$ decrease rapidly after the changing point and both have almost equal value near z=15 cm. FIG. 11 illustrates the $C_V^R(z)$ and $C_I^R(z)$ in variable growth stages from G=5 K cm$^{-1}$ to 10 K cm$^{-1}$ for the NOC growth method. At the changing point, for $C_V^R(z)$ and $C_I^R(z)$, each concentration or each Si melt temperature has the same value, and the curves are connected to each other. Both the vacancy concentration and the interstitial concentration approach to zero gradually after the changing point. This is because the diffusion of each point defect becomes faster from the changing point due to the larger temperature gradient G, and this is especially significant for the interstitial concentration. At the changing point, the diffusion flux of each point defect is not as great as the diffusion flux near the growth interface. However, the greater the temperature gradient G, the greater the influence on the concentration distribution of point defects, but unlike the CZ growth method, the diffusion flux of interstitial Si atoms may not be greatly increased.

(6) The Cross Point of $J_V^{Eq}(z)=J_I^{Eq}(z)$, the Cross Point of $C_V^{Total}(z)=C_I^{Total}(z)$, and the Cross Point of $C_V^R(z)=C_I^R(z)$ in NOC Growth Method By using formula (11) and formula (12), a cross point $Z_C$ of $J_V^{eq}(z)=J_I^{eq}(z)$ can be expressed as follows:

$$z_C=(T_m-\sqrt{T_m(D_{I\,mp}C_{Imp}^{eq}-D_{V\,mp}C_{V\,mp}^{eq})/(2vL'} \\ (C_{V\,mp}^{eq}-C_{Imp}^{eq}))/G \quad (34))$$

The cross point $Z_C$ strongly depends on the temperature gradient G and decreases rapidly as the temperature gradient G increases. By using formula (27) and formula (28), the cross point of $C_V^{Total}(z)=C_I^{Total}(z)$ can be expressed as follows:

$$z_C=(T_m-\sqrt{2vL'(C_{V\,mp}^{eq}-C_{Imp}^{eq})/(T_m(D_{I\,mp} \\ C_{Imp}^{eq}-D_{V\,mp}C_{V\,mp}^{eq})))/G}. \quad (35)$$

The cross point $Z_C$ strongly depends on the temperature gradient G and decreases rapidly as the temperature gradient G increases.

By using formula (32) and formula (33), the cross point $Z_C$ of $C_V^R(z)=C_I^R(z)$ can be expressed as follows:

$$z_C=(T_m A-\sqrt{(T_m^2 A(A-1)+G)})/G \quad (36)$$

where $$A=C_{Imp}^{eq}(C_{V\,mp}^{eq}-C_{Imp}^{eq})/(a(D_{I\,mp} \\ C_{Imp}^{eq}-D_{V\,mp}C_{V\,mp}^{eq})(C_{V\,mp}^{eq}+C_{Imp}^{eq})) \quad (37)$$

Figure 12:
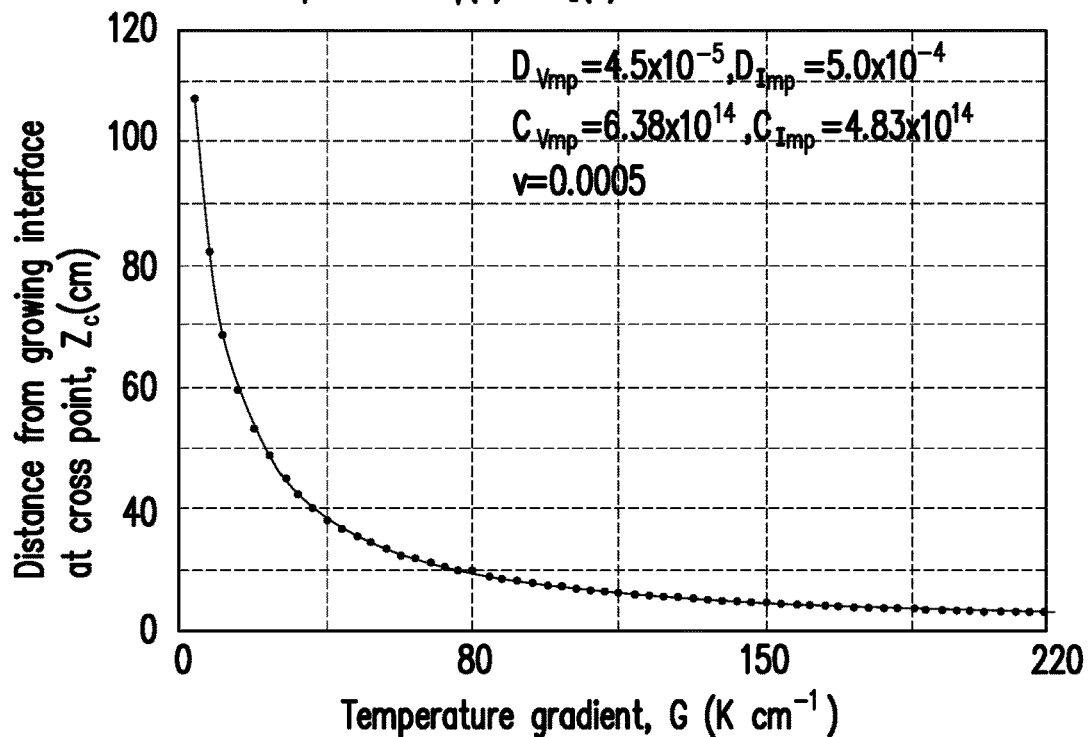
FIG. 12 illustrates that the cross point $Z_C$ of $C_V^R(z)=C_I^R(z)$ serves as a function of temperature gradient G when the growth rate $\upsilon$ is equal to 0.0005 cm s$^{-1}$.

FIG. 12 illustrates that the cross point $Z_C$ of $C_V^R(z)=C_I^R(z)$ serves as a function of temperature gradient G when the growth rate υ is equal to 0.0005 cm s$^{-1}$ The cross point $Z_C$ strongly depends on the temperature gradient G and decreases rapidly as the temperature gradient G increases. Finally, the cross point $Z_C$ is saturated near $Z_C$=10 cm.

However, under current conditions, the cross point $Z_C$ is still far from the growing interface. As shown in FIG. 12, when considering performing the pair-annihilation on the diffused point-defect pairs, it is considered that the pair-annihilation is performed on the accumulation of the diffusion fluxes of the vacancies and interstitial Si atoms in the Si ingot single crystal. The cross point $Z_C$ is located far away from the growth interface, and the two concentrations also have a trend as shown in FIG. 9. Note that as the temperature gradient G in the Si ingot single crystal increases, the distance of which the cross point ZC is from the growth interface decreases rapidly and becomes close to the growth interface. That is, the vacancy concentration and the interstitial concentration gradually decrease and become close to 0 cm$^{-3}$ as the distance from the growth interface increases.

Compared to the Si ingot single crystal grown by the CZ growth mode, above the surface of the Si melt, there is a relatively high temperature in Si ingot single crystal grown by the NOC growth method during the growth process, and this is because part of the Si ingot single crystal grown by the NOC growth method remains inside the Si melt, and a strong heat flow from the Si ingot single crystal inside the Si melt occurs on the upper part of the Si ingot single crystal. As shown in FIG. 5, the vacancy concentration and the interstitial concentration formed based on the formation energy decrease with the temperature distribution in the Si ingot single crystal. The pair-annihilation of the vacancies and interstitial Si atoms extends from the growth interface along the slow temperature gradient to the upper part of the Si ingot single crystal during the growth process. This is very different from the CZ growth method, which has an abrupt temperature gradient near the growth interface above the surface of the Si melt.

For the diffused vacancies and interstitial Si atoms, the pair-annihilation may occur as the temperature decreases during the growth process. Finally, after the pair-annihilation, when the temperature decreases slowly during the growth process, and the remained species depends on the growth conditions. After the Si ingot single crystal is rapidly cooled, the interstitial Si atoms or vacancies may eventually become dislocation clusters or micro-voids. During the growth process, the pair-annihilation may not fully reach its equilibrium state at a relatively high temperature. Therefore, how to activate the free energy required for the annihilation reaction between the vacancies and the interstitial Si atoms is further illustrated in the subsequent paragraphs.

The temperature gradient G and the growth rate υ greatly affect the concentration distribution considered for the pair-annihilation due to the diffusion flux.

A greater temperature gradient G may generate a greater $J_I^D(z)$ or a greater $C_I^J(z)$, and the remained diffused interstitial Si atom $\gamma(z)$ is used to generate a greater second pair-annihilation. For the NOC growth method, the growth rate υ depends on the temperature gradient G and becomes greater as the temperature gradient G becomes lesser. Generally, the product Gυ between the temperature gradient G and the growth rate υ is equal to the cooling rates of the Si ingot single crystal and the Si melt.

The accumulation effect of the diffusion flux of the vacancy and interstitial Si atoms in the Si ingot single crystal and the effect of the pair-annihilation on the diffused point defects are major advantages of the NOC growth method. FIG. 9 illustrates the variations of the positions of the vacancy concentration and the interstitial concentration from the growth interface along the crystal axis direction when the diffusion fluxes of the vacancies and the interstitial Si atoms are pair-annihilated during the growth process, at or near the critical point. As shown in FIG. 9, when the temperature gradient G is equal to 10 K/cm and the growth rate υ is equal to 0.005 cm s$^{-1}$, $C_V^R(z)$ and $C_I^R(z)$ come near to each other. Both $C_V^R(z)$ and $C_I^R(z)$ decrease toward a very low concentration close to 0 near z=20 cm.

FIG. 11 also illustrates the gradual and decreasing trends of the two point defects after the changing point. When such conditions can be used for actual growing Si ingot single crystals, a Si ingot single crystal with ultra-low point defects can be realized through natural crystal growth inside the Si melt. The length of the Si ingot single crystal outside the Si melt is a very important factor for obtaining defect-free parts of the Si ingot single crystal. This condition is very useful, which may be confirmed through experiments. This phenomenon is somewhat similar to the CZ growth method in which a greater temperature gradient G or a lesser v/G is used to increase the diffusion flux of the interstitial Si atoms to obtain a defect-free region. To obtain a defect-free Si ingot single crystal like that in the CZ growth method, as shown in FIG. 7 and FIG. 9, in the NOC growth method of the disclosure, by controlling the temperature gradient G and the growth rate υ during the growth of the Si ingot single crystal, the pair-annihilation effect between diffused point defects may be effectively controlled to reduce the remained concentration of the point defects. In this case, the length of the Si ingot single crystal inside the Si melt is a very important factor in determining the temperature distribution in the Si ingot single crystal and the diffusion flux at the changing point.

The inventors continue to study the influence of the temperature gradient G and the growth rate υ on the concentration of remained point defects in the NOC growth method. Regarding the constructed theory of the embodiment, simulated effects such as the accumulation of diffusion fluxes and their pair-annihilation mechanisms, the subsequent development of the dislocation-free Si ingot single crystals grown by the NOC growth method should be confirmed in subsequent embodiments. Finally, the precise concentration variations in the actual Si ingot single crystals grown by the NOC growth method strongly depends on the whole temperature profile T(z).

Figure 13:
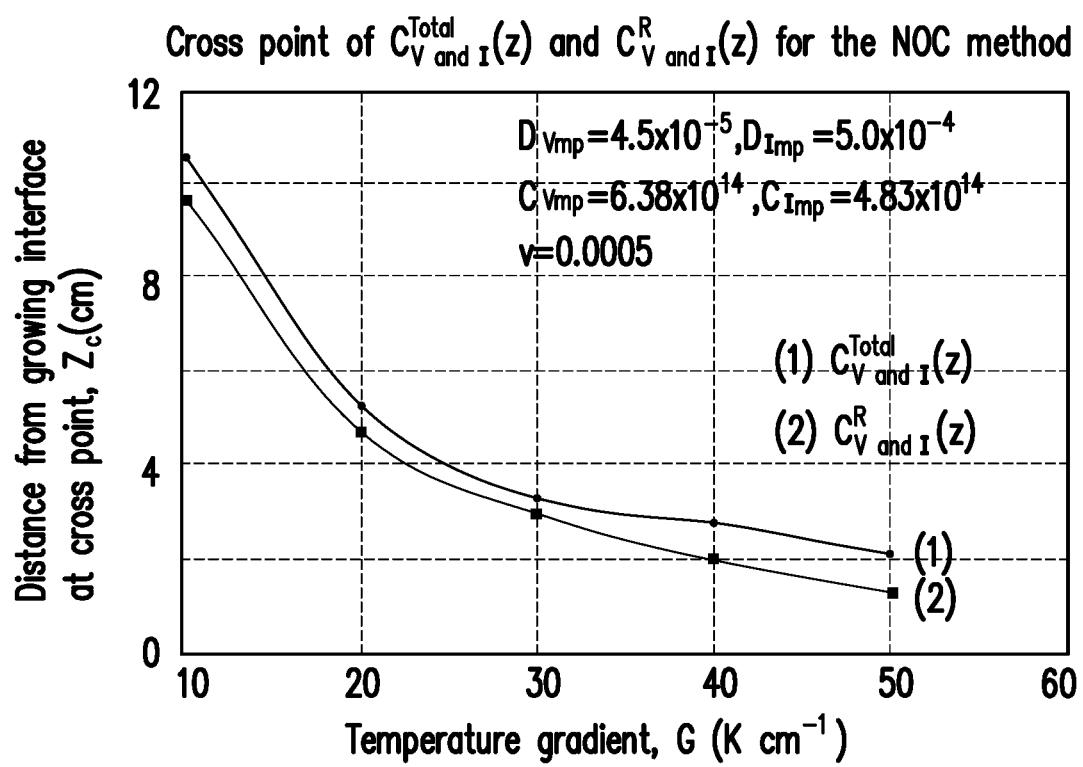
FIG. 13 illustrates the effective points where both the vacancy concentration and the interstitial concentration are less than $1\times10^{14}$ cm$^{-3}$ over 5 cm from the growth interface.

FIG. 13 illustrates the effective points where both the vacancy concentration and the interstitial concentration are less than $1 \times 10^{14}$ cm$^{-3}$. FIG. 13 illustrates the effective points of $C_{V\ and\ I}^{Total}(z)$ and $C_{V\ and\ I}^{R}(z)$ at the distance from the growth interface.

The distance between $C_{V\ and\ I}^{R}(z)$ at the effective point and the growth interface is less than the distance between $C_{V\ and\ I}^{Total}(z)$ at the effective point and the growth interface, ranging from 1 cm to 10 cm.

After the diffused point defects are pair-annihilated, the actual vacancy concentration and the actual interstitial concentration in the Si ingot single crystal grown by the NOC growth method are finally calculated. By selecting the temperature gradients G and the growth rate υ, it is obvious that the concentrations have suitable growth conditions; with the conditions, $C_V^R(z)$ and $C_I^R(z)$ come near to each other all over the entire Si ingot single crystal; and they decrease to a very little concentration. By controlling the temperature gradient G and the growth rate υ during the growth of the Si ingot single crystal, the actual vacancy concentration and the actual interstitial concentration can be greatly changed. The cross point of the vacancy concentration and the interstitial concentration mainly depends on the temperature gradient G.

Based on the above, a summary of making the concentration $C_V$ and concentration $C_I$ come near to each other by controlling the method for producing the Si ingot single crystal and the temperature gradient G in the apparatus based on the constructed theory in the disclosure is illustrated as follows:

(1) As shown in FIG. 5, for the NOC method using the Linear T profile, the formulae regarding that the vacancy concentration $C_V$ and the interstitial concentration $C_I$ during the crystal growth process decrease due to pair-annihilation can be expressed by the formulae (19)-(21).

(2) As shown in FIG. 7, in the NOC growth method, the diffusion fluxes of the two point defects of the vacancies and the interstitial Si atoms are taken into account, the temperature gradient (G) inside the Si ingot single crystal is also taken into account, and it is concluded that the parameters satisfy the formulae (21), (23), and (24).

(3) As shown in FIG. 8, both FIG. 5 and FIG. 7 are used to discuss the changes in the vacancy concentration $C_V$ and the interstitial concentration $C_I$ in the NOC growth method. After considering all parameters, it is concluded that the parameters satisfy the formulae (19)-(21), and (25)-(28).

In FIG. 8, the temperature gradient G is equal to 10 K cm$^{-1}$ and v is equal to 0.0005 cm$^{s-1}$.

(4) As shown in FIG. 9, referring to FIG. 5, FIG. 7, and FIG. 8 altogether, combining the above changes, in the NOC growth method, when growing crystals under the conditions of diffusion flux and mild temperature gradient, the action of pair-annihilation may be promoted. It is concluded that the parameters satisfy the formulae (29), and (31)-(33).

In FIG. 9, G is equal to 10 K cm$^{-1}$ and v is equal to 0.0005 cm$^{s-1}$. Compared to FIG. 8, due to the pair-annihilation of the diffused elements of the point defect, the vacancy concentration and the interstitial concentration are almost similarly reduced. The difference between the vacancy concentration and the interstitial concentration becomes very little throughout the Si ingot single crystal at or near the critical point As both the vacancy concentration and interstitial concentration gradually and synchronically decrease, it is estimated that the method for producing the Si ingot single crystal of the disclosure can realize a Si ingot single crystal that is almost defect-free.

Moreover, in the NOC growth method of the Si ingot single crystal of the disclosure, by selecting the temperature gradient G and the growth rate υ, the vacancy concentration and the interstitial concentration can be freely set according to the process requirements, so as to obtain the desired gradual curve of the vacancy concentration and interstitial concentration, which can increase the process margin, reproducibility, and universality.

Based on the above, some embodiments are listed below for confirmation.

Figure 14:
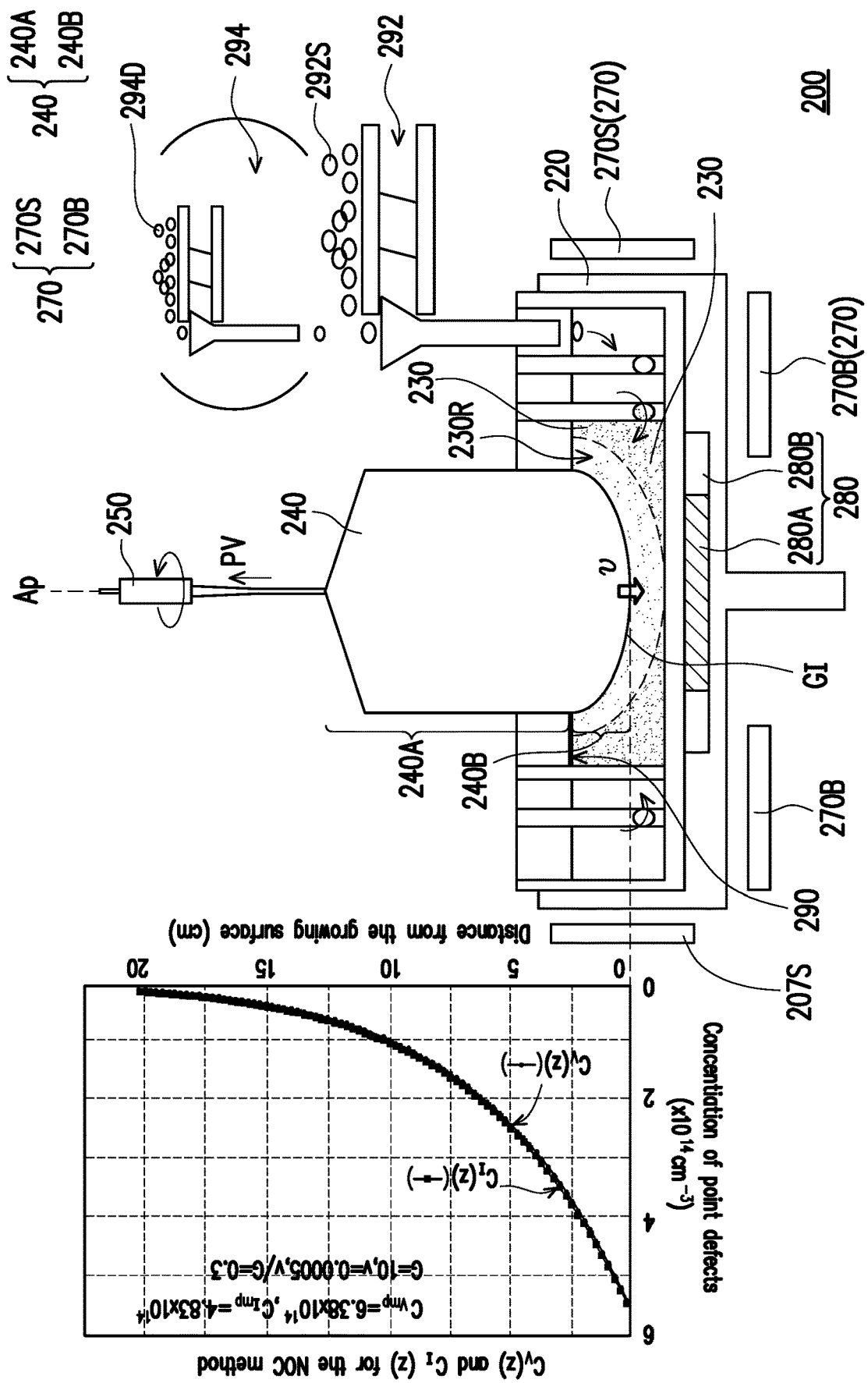
FIG. 14 is a schematic view illustrating an apparatus for producing a Si ingot single crystal by the NOC growth method according to an embodiment of the disclosure.

FIG. 14 is a schematic view illustrating an apparatus for producing a Si ingot single crystal by the NOC growth method according to an embodiment of the disclosure. Referring to FIG. 14, an apparatus 200 of a Si ingot single crystal produces a Si ingot single crystal by a noncontact crucible (NOC) growth method. The apparatus 200 of a Si ingot single crystal includes a crucible 220, a Si melt 230, a Si ingot single crystal 240, a temperature gradient controller 270, a liquid level controller 290, and a pulling mechanism 250. As shown in FIG. 14, the Si melt 230 is disposed in the crucible 220. In addition, as the foregoing description, by using a plate 280 having the thermal insulator 280A disposed below the bottom of the crucible 220, a large and deep low temperature region 230R may be formed in the upper central portion of the Si melt 230. The low temperature region 230R is substantially disposed in the center of the Si melt 230, and the temperature of the low temperature region 230R ranges from the Si freezing point to the Si melting point. The configuration of the plate 280 is similar to that of the plate 180 as shown in FIG. 4, for example, and the plate 280 may include both a thermal insulator 280A in the central portion of the plate 280 and a graphite plate 280B in the periphery portion of the plate 280.

As shown in FIG. 14, the Si ingot single crystal 240 includes an upper Si ingot single crystal part 240A above the surface of the Si melt 230 and a remaining Si ingot single crystal part 240B remained in the Si melt 230. During the growth of the Si ingot single crystal 240, the remaining Si ingot single crystal part 240B is remained in the low temperature region 230R of the Si melt 230 and grown at a growth rate υ, and there is a growth interface GI between the remaining Si ingot single crystal part 240B and the Si melt 230. Moreover, the Si ingot single crystal 240 has a vacancy concentration $C_V$ and an interstitial concentration $C_I$ during the growth process, and the vacancy concentration distribution and the interstitial concentration distribution vary with the distance from the growth interface, respectively.

The temperature gradient controller 270 of the embodiment provides a temperature gradient G during the growth of the Si ingot single crystal 240, so that the vacancy concentration distribution and the interstitial concentration distribution of the Si ingot single crystal 240 decrease as the distance from the growth interface increases, the vacancy concentration $C_V$ and the interstitial concentration $C_I$ decrease respectively and come near to each other. The liquid level controller 290 is used to control the liquid level of the Si melt 230. The pulling mechanism 250 pulls up the grown upper Si ingot single crystal part 240A along a pulling axis direction Ap and keeps the remaining Si ingot single crystal part 240B in the Si melt 230.

Note that the schematic view of the vacancy concentration $C_V$ and the interstitial concentration $C_I$ in the left part of FIG. 14 is the same as that of FIG. 9. In other words, in the method and the apparatus for producing the Si ingot single crystal of the embodiment, based on the constructed theory, during the manufacturing process, both the vacancy concentration distribution $C_V$ and the interstitial concentration distribution $C_I$ decrease as the distance from the growth interface increase. Moreover, the difference between the vacancy concentration $C_V$ and the interstitial concentration $C_I$ in the Si ingot single crystal 240 also decreases as the distance from the growth interface increases. Therefore, in the method and the apparatus for producing the Si ingot single crystal in the disclosure, the temperature gradient G and the growth rate υ are controlled on purpose, so that the vacancy concentration distribution $C_V$ and the interstitial concentration distribution $C_I$ are effectively pair-annihilated during the growth process, and ultra-low defect Si ingot single crystals are produced.

Referring to FIG. 14, in the embodiment, the apparatus 200 of a Si ingot single crystal may further include a silicon raw material supplier 292. A silicon raw material 292S is supplied to the Si melt 230 in the form of chips or a Si melt. In the embodiment, the supply weight of the silicon raw material supplier 292 can be controlled by the liquid level controller 290 to be substantially equal to the weight of the grown upper Si ingot single crystal part 240A pulled up by the pulling mechanism 250. Moreover, in the embodiment, the apparatus 200 of a Si ingot single crystal may further include a dopant supplier 294 for supplying a dopant 294D to the Si melt 230.

Figure 15:
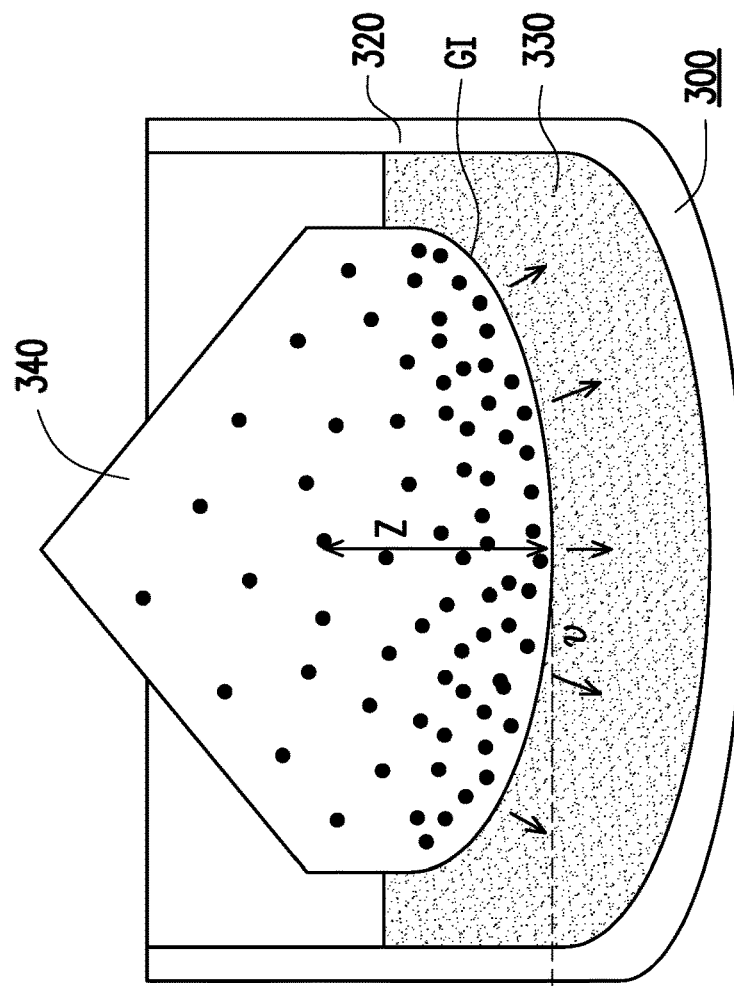
FIG. 15 is a schematic view illustrating a system for producing a Si ingot single crystal according to an embodiment of the disclosure.
Figure 15:
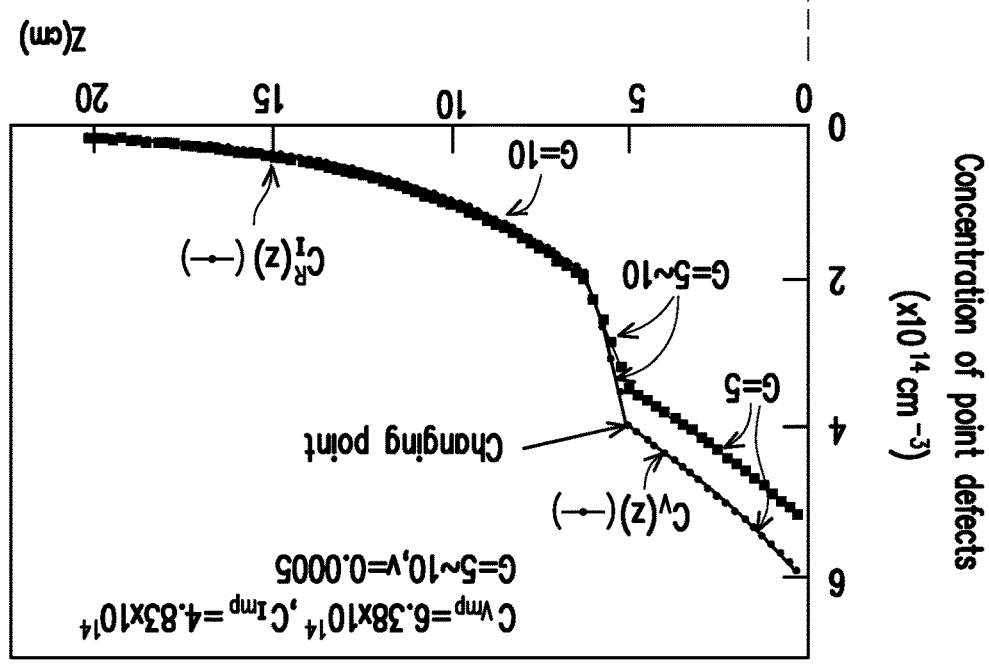

FIG. 15 is a schematic view illustrating a system for producing a Si ingot single crystal according to an embodiment of the disclosure. In the right part of FIG. 15, a schematic view illustrates a Si ingot single crystal is grown in the Si melt, and the distribution of the vacancy concentration $C_V$ and the interstitial concentration $C_I$ of the Si ingot single crystal grown in the Si melt varying with the distance Z from the growth interface is illustrated in the left part of FIG. 15. Regarding the distribution of the vacancy concentration $C_V$ and the interstitial concentration $C_I$, refer to detailed and related description of FIG. 11. Referring to FIG. 15, an apparatus 300 of a Si ingot single crystal includes a Si melt 330 disposed in a crucible 320, and the Si ingot single crystal 340 grows in the Si melt 330 at a growth rate υ. According to the constructed theory, the temperature gradient G and the growth rate υ in the Si melt 330 are reproducibly controlled on purpose, so that during the growth process the vacancy concentration distribution $C_V$ and the interstitial concentration distribution $C_I$ are effectively pair-annihilated to produce ultra-low defect Si ingot single crystals.

With the disclosure, the specific implementation of growing an ultra-high-quality Si ingot single crystal having defect-free regions is illustrated with the following embodiments as an example.

Example 1

In Example 1, the size of the crucible is 50 cm in diameter, and the weight of the silicon raw material weighs 40 kg.

In an apparatus for producing a Si ingot single crystal, a silicon raw material is filled into a quartz crucible that is not coated with silicon nitride powder and placed in a predetermined position. Meanwhile, a board (60 cm in diameter) with the following structure is pre-placed under the bottom of the crucible. The board includes a circular heat insulation board made of graphite with a diameter of 40 cm and an annular board made of a material with good thermal conductivity around the circular heat insulation board.

Then, the temperature is increased to about 1450° C. in an argon (Ar) atmosphere to melt the silicon raw material completely. Next, the temperature of the crucible is decreased to 1.5 k less than the temperature of the Si melting point, the Si seed crystal is brought to the surface of the Si melt, and the Si seed crystal is brought into contact with the surface of the Si melt to start to grow crystals. After that, by using the necking technique, the crystals start from the seed crystals to undergo no dislocation of the grown crystals.

Moreover, the temperature of the entire Si melt is decreased to increase the low temperature area, and the crystals are spread along the surface of the Si melt before the pull-up growth is started.

At the stage, the temperature gradient is set to 10 K/cm. Thereafter, while the temperature of the Si melt is reduced at a cooling rate of 0.2 K/min, the Si ingot single crystal is grown in the low-temperature region in the Si melt. Moreover, after the crystal grows to a predetermined size, as it grows, the grown and dislocation-free Si ingot single crystal is pulled up at a pulling rate of 0.0005 cm/s (0.3 mm/min), and meanwhile the Si ingot single crystal is continuously grown in the Si melt.

During the growth process, the edge of the Si ingot single crystal is continuously observed through the observation window so that the Si ingot single crystal is not in contact with the crucible wall. The temperature is decreased at a range of 48 k and the growth time is 240 minutes. When the Si ingot single crystal is grown to a predetermined length, the pulling rate is gradually increased to separate the grown Si ingot single crystal from the Si melt, and the bottom of the Si ingot single crystal is finely squeezed to stop the growth. The grown ingot has a convex bottom to the growth direction.

COP Defect Evaluation Method:

To evaluate COP, the measurement conditions are as follows:

Polished wafer: complete Particle counter inspection
The COP of advanced equipment is basically zero.

According to the method of Example 1, the Si ingot single crystal with a weight of 13 kg, a length of 9 cm, and a maximum diameter of 35 cm is produced. Moreover, according to the evaluation equipment and the evaluation method, it can be confirmed that the part of the Si ingot single crystal about 4 cm away from the top have no void defects or dislocation loops because there are almost no remained point defects.

Example 2

In Example 2, the crucible has a diameter of 25 cm, and the silicon raw material weighs 10 kg. Meanwhile, the Si melt has a depth of about 9 cm.

In an apparatus for producing a Si ingot single crystal, a silicon raw material is filled into a quartz crucible that is not coated with silicon nitride powder and placed in a predetermined position. Meanwhile, a composite board (20 cm in diameter) with the following structure is pre-placed under the bottom of the crucible. The composite board includes a circular heat insulation board made of graphite with a diameter of 25 cm and an annular board made of a material with good thermal conductivity around the circular heat insulation board.

Then, the temperature is increased to about 1450° C. in an argon (Ar) atmosphere to melt the silicon raw material completely. Next, the temperature of the crucible is decreased to 1.5 k less than the temperature of the Si melting point, the Si seed crystal is brought to the surface of the Si melt, and the both the Si seed crystal and the surface of the Si melt are in contact with each other to start to grow crystals. After that, a fine seed crystal necking with a diameter of 4 mm to 8 mm is grown at a pulling rate of 1-5 mm/min to eliminate defects.

Then, the Si melt is cooled at a cooling temperature rate of 0.2K/min, and a 40 k supercooling degree is applied to the Si melt to form a low-temperature region from the upper center of the Si melt to the bottom of the Si melt. In the low temperature region, the Si ingot single crystal diffuses along the surface of the Si melt, and meanwhile the Si ingot single crystal grows into the Si melt. At the stage, the temperature gradient is set to 10 K/cm.

After the crystal grows to a predetermined size, the Si ingot single crystal starts to be pulled up at a rate of 0.12 mm/min, and meanwhile the growth of the Si ingot single crystal in the Si melt continues. By synchronically pulling up and growing the single crystals, the crystal growth has proceeded for 200 minutes.

Subsequently, when the Si ingot single crystal is grown to a predetermined length, the pulling rate is gradually increased to separate the grown Si ingot single crystal from the Si melt, and the bottom of the Si ingot single crystal is finely squeezed to stop the growth.

According to the method of Example 2, the Si ingot single crystal with a weight of 5 kg, a length of 15 cm, and a maximum diameter of 17 cm is produced. The grown ingot has a convex bottom to the growth direction. Moreover, according to the evaluation equipment and the evaluation method, it can be confirmed that there are almost no remained point defects about 5 cm from the top of the Si ingot single crystal, so it is confirmed that there are no void defects or dislocation loops, and the crystal is defect-free.

Ultra-high-quality Si ingot single crystals are produced by the method for producing a Si ingot single crystal of the disclosure as shown in Examples 1 and 2. The Si ingot single crystals are grown in the low temperature region of the Si melt without contacting the crucible wall. Meanwhile, in the initial stage of the growth of the Si ingot single crystals, the crystals are expanded along the surface of the Si melt while being supercooled, and meanwhile the crystals are expanded into the Si melt.

Then, the Si ingot single crystals are grown by synchronically pulling up the crystal and growing the crystal in the Si melt. The growth interface of the Si ingot single crystal always grows in a downward convex manner in the low temperature region. Moreover, the diameter of the growing Si ingot single crystal is correlated strongly with the diameter of the insulating material, and the greater the diameter of the insulating material, the greater the diameter of the Si ingot single crystal.

The defect distribution in a cutout crystal from the upper part of the grown Si ingot single crystal is studied. No point defects or dislocation loops are observed in the cutout crystal region, and it is found that the distribution of remained point defects is relatively low. By producing a Si ingot single crystal while maintaining the temperature gradient and the growth rate according to the disclosure, the distribution of remained point defects is relatively low on the upper part of the Si ingot single crystal far from the growth interface, and crystals substantially with no defects can be obtained.

In the NOC growth method according to the disclosure, by controlling the growth conditions according to the disclosure, conventional single crystal growth equipment is not required to precisely control the temperature gradient and growth conditions at the growth interface. It is found that the method for producing the Si ingot single crystal of the disclosure is a universal and highly controllable technique for obtaining defect-free crystals.

Based on Examples 1 and 2, the parameters in the method for producing the Si ingot single crystal are summarized as follows:

TABLE 2

|  |  | Example 1 | Example 2 |
|---|---|---|---|
| Crucible diameter | (cm) | 50 | 25 |
| Si raw material weight | (kg) | 40 | 10 |
| Temperature gradient G | (K/cm) | 10 | 10 |
| Crucible bottom insulator | Outer ring diameter(cm) | 60 | 25 |
|  | Inner insulator diameter(cm) | 40 | 20 |
| Pulling rate | (mm/min) | 0.3 | 0.12 |
| Temperature reduction | Cooling rate(k/min) | 0.2 | 0.2 |
|  | ΔT (k) | 48 | 40 |
| Growth time | (min) | 240 | 200 |
| Si ingot single crystal weight | (kg) | 13 | 5 |
| Si ingot single crystal length | (cm) | 9 | 15 |
| Si ingot single crystal maximum diameter | (cm) | 35 | 17 |
| Crystal defects | COP | none | none |
|  | Ring-OSF | none | none |
|  | Interstitial Si region | none | none |

(The Specific Effect Based on the Configuration of the Example)

The disclosure relates to a method for producing ultra-high-quality Si ingot single crystals for highly integrated semiconductor devices. The method reduces the vacancy concentration, the interstitial concentration, and the remained point defect concentration to the maximum limit, and there is no point defect, void, or dislocation loop; and the method relates to a universal technology for producing defect-free Si ingot single crystals.

The Si ingot single crystal growing technology as the essence of the disclosure is the NOC growth method based on disposing a low temperature region in the Si melt, and the application of the growing technology contribute to great effects.

When the Si ingot single crystal is grown by the method of the disclosure, the vacancy concentration and the interstitial concentration in the Si ingot single crystal decrease along the increasing pulling axis direction as the distance from the growth interface increases.

Therefore, when the Si ingot single crystal is pulled up and grown to a length that can be set to be less than $1 \times 10^{14}/cm^3$ at each point defect concentration, the vacancy concentration, the interstitial concentration, and the remained point defect concentration reach the limit in the constructed model, based on this, a defect-free Si ingot single crystal with no voids and no dislocation loops can be produced.

To increase the ratio of defect-free crystal parts, the length of the pulled-up growth has to be extended to a certain extent. Moreover, the greater the temperature gradient, the closer the position of the cross point at which the vacancy concentration and interstitial Si concentration are same is to the position of the growth interface. The smaller the temperature gradient, the lower the vacancy concentration at the cross point is to the lowest limit.

In this way, with the universal technology described in the specification, the vacancy concentration, the interstitial concentration, and the remained point defect concentration can be decreased as the crystal length increases, resulting in defects. Defect-free Si ingot single crystals with no dislocation loop and no point defects can be obtained. Therefore, the disclosure is a technology contributing to the diffusion of ultra-high-quality Si ingot single crystals.

Particularly, the disclosure completely develops a method for producing Si ingot single crystals in the NOC growth method. The method combines the pulling rate of the Si ingot single crystal with the growth rate of the Si ingot single crystal in the Si melt to fix the position of the growth interface position. Moreover, the method is a method for producing Si ingot single crystals in which controllable variables such as temperature gradient and growth rate are proposed, so that the operator can control the temperature gradient of the Si melt in a more precise and easy manner to produce the Si ingot single crystals with the established point defect concentration relationship.

Moreover, the NOC growth method contributes to producing Si ingot single crystals with a large diameter ratio, so a smaller-scale apparatus compared to conventional ones may be adopted to produce Si ingot single crystals with the same diameter, which in turn has a great influence on the diffusion of low-cost and large-diameter semiconductor single crystals.

(Application to the Industrial Field)

The disclosure relates to a universal and easy-to-control method for producing ultra-high-quality Si ingot single crystals with a point defect concentration of $1 \times 10^{14}/cm^3$ or less for semiconductors, relates to the field of producing highly integrated Si, and can be applied to single crystals used in semiconductors to provide innovative technologies.

The innovative technology provided is capable of producing large-diameter Si ingot single crystals for semiconductor devices by using equipment with a diameter less than that of the equipment in the CZ growth method.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A method for producing a Si ingot single crystal, which is a noncontact crucible (NOC) growth method that the Si ingot single crystal is grown within a Si melt without contacting a wall of a crucible, the method for producing the Si ingot single crystal, comprising:
    a Si ingot single crystal growing step, wherein the Si ingot single crystal is grown within the Si melt disposed in the crucible, the Si ingot single crystal growing step comprising:
    disposing a low temperature region in the Si melt;
    disposing a Si seed crystal to contact a surface of the Si melt to start crystal growth, the Si ingot single crystal is grown within the low temperature region under the surface of the Si melt along the surface of the Si melt or toward the inside of the Si melt, wherein the Si ingot single crystal has a growth interface between the Si ingot single crystal and the Si melt, the Si ingot single crystal has a vacancy concentration distribution and an interstitial concentration distribution in which a vacancy concentration and an interstitial concentration respectively vary with a distance from the growth interface;

adjusting a temperature gradient in the Si ingot single crystal and a growth rate of the Si ingot single crystal in the Si melt, so that in the vacancy concentration distribution and the interstitial concentration distribution, along with an increase of the distance from the growth interface, the vacancy concentration and the interstitial concentration in the Si ingot single crystal respectively decrease, the greater a distance from the growth interface, the smaller a difference between the vacancy concentration and the interstitial concentration; and a continuous growing step, repeating the step of adjusting the temperature gradient and the growth rate of the Si ingot single crystal in the Si melt to obtain the Si ingot single crystal.

2. The method for producing the Si ingot single crystal as claimed in claim 1, wherein the temperature gradient in the Si ingot single crystal growing step ranges from of 2 K/cm to 220 K/cm.

3. The method for producing the Si ingot single crystal as claimed in claim 1, wherein the growth rate in the Si ingot single crystal growing step ranges from of 0.0002 cm/s to 0.002 cm/s.

4. The method for producing the Si ingot single crystal as claimed in claim 3, wherein in the Si ingot single crystal growing step, another temperature gradient different from the temperature gradient is used as different growth stages during growth of the Si ingot single crystal.

5. The method for producing the Si ingot single crystal as claimed in claim 4, wherein the different growth stages with different temperature gradients comprises:
a first growth stage of a first temperature gradient closer to a growing interface, and
a second growth stage of a second temperature gradient far away the growing interface, wherein the first temperature gradient is less than the second temperature gradient.

6. The method for producing the Si ingot single crystal as claimed in claim 5, wherein the vacancy concentration distribution and the interstitial concentration distribution between two different temperature gradients respectively have a changing point, both the vacancy concentration and the interstitial concentration decreases after the changing point.

7. The method for producing the Si ingot single crystal as claimed in claim 5, wherein the first temperature gradient is 10 K/cm, and the second temperature gradient is 20 K/cm.

8. The method for producing the Si ingot single crystal as claimed in claim 4, wherein the different growth stages with different temperature gradient comprises:
a first growth stage of a first temperature gradient closer to a growing interface,
a second growth stage of a second temperature gradient, and
a third growth stage of a third temperature gradient far away the growing interface,
wherein the first temperature gradient is less than the second temperature gradient, and the second temperature gradient is less than the third temperature gradient.

9. The method for producing the Si ingot single crystal as claimed in claim 8, wherein the Si ingot single crystal growing step comprises a critical distance Zc where the vacancy concentration in the Si ingot single crystal and the interstitial concentration are equal, and the critical distance Zc is in the second growth stage of the second temperature gradient.

10. The method for producing the Si ingot single crystal as claimed in claim 1, wherein the Si ingot single crystal is grown until a point defect of the Si ingot single crystal is $1 \times 10^{14}/cm^3$ or less, or the COP concentration of the Si ingot single crystal is $1 \times 10^7/cm^3$ or less.

11. The method for producing the Si ingot single crystal as claimed in claim 1, wherein the Si ingot single crystal growing step comprises a critical distance Zc where the vacancy concentration in the Si ingot single crystal and the interstitial concentration are equal in a pulling axis direction.

12. The method for producing the Si ingot single crystal as claimed in claim 11, wherein the critical distance Zc in the Si ingot single crystal decreases as the temperature gradient increases.

13. The method for producing the Si ingot single crystal as claimed in claim 1, further comprising:
disposing a bottom heater under a bottom of the crucible and disposing a thermal insulator between the bottom heater and the crucible, so as to form the low temperature region, wherein a diameter of the thermal insulator is less than a diameter of the crucible.

14. The method for producing the Si ingot single crystal as claimed in claim 13, further comprising a plate below the bottom of the crucible, wherein the plate comprises both the thermal insulator in a central portion of the plate and a graphite plate in a periphery portion of the plate, a thermal conductivity of the thermal insulator in the central portion is less than a thermal conductivity of the graphite plate in the periphery portion.

15. The method for producing the Si ingot single crystal as claimed in claim 14, wherein the thermal conductivity of the thermal insulator in the central portion at the Si melting temperature ranges from 0.15 W/mk to 0.55 W/mk, and the thermal conductivity of the graphite plate in the periphery portion at the Si melting temperature ranges from 20 W/mk to 60 W/mk.

16. The method for producing the Si ingot single crystal as claimed in claim 1, wherein the obtained Si ingot single crystal comprises an upper Si ingot single crystal part disposed above the Si melt surface and a remaining Si ingot single crystal part disposed within the Si melt, the remaining Si ingot single crystal part is grown within the Si melt through performing the continuous growing step by NOC growth method, the method for producing the Si ingot single crystal further comprising:
a pulling step, pulling the upper Si ingot single crystal part along a pulling axis direction together with the remaining Si ingot single crystal whose lower part still remains within the Si melt, wherein the pulling step is in conjunction with the growth of the Si ingot single crystal; and
repeating the pulling step of pulling the upper Si ingot single crystal part together with the remaining Si ingot single crystal whose lower part still remains within the Si melt while performing the continuous growing step of the remaining Si ingot single crystal part.

17. The method for producing the Si ingot single crystal as claimed in claim 16, further comprising:
supplying a Si raw material in a form of chips or melt into the Si melt, wherein a supply weight of the Si raw material is controlled to be substantially equal to a weight of the upper Si ingot single crystal part pulled in the pulling step, and a position of the growth interface is substantially fixed.

* * * * *